(12) United States Patent
Chen et al.

(10) Patent No.: US 12,252,783 B2
(45) Date of Patent: Mar. 18, 2025

(54) CHEMICAL VAPOR DEPOSITION FOR UNIFORM TUNGSTEN GROWTH

(71) Applicant: Taiwan Semiconductor Manufacturing Company, Ltd., Hsinchu (TW)

(72) Inventors: Pin-Wen Chen, Keelung (TW); Yuan-Chen Hsu, Hsinchu (TW); Ken-Yu Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 467 days.

(21) Appl. No.: 17/444,585

(22) Filed: Aug. 6, 2021

(65) Prior Publication Data

US 2023/0038744 A1    Feb. 9, 2023

(51) Int. Cl.
| | | |
|---|---|---|
| *C23C 16/14* | (2006.01) | |
| *C23C 16/52* | (2006.01) | |
| *H01L 21/28* | (2006.01) | |
| *H01L 21/285* | (2006.01) | |
| *H01L 29/40* | (2006.01) | |
| *H01L 29/66* | (2006.01) | |

(52) U.S. Cl.
CPC ........... *C23C 16/14* (2013.01); *C23C 16/52* (2013.01); *H01L 21/28079* (2013.01); *H01L 21/28568* (2013.01); *H01L 29/401* (2013.01); *H01L 29/66545* (2013.01)

(58) Field of Classification Search
CPC ... C23C 16/14; C23C 16/52; H01L 21/28079; H01L 21/28568; H01L 29/401; H01L 29/66545
See application file for complete search history.

(56) References Cited

U.S. PATENT DOCUMENTS

| | | | | |
|---|---|---|---|---|
| 5,407,698 A | * | 4/1995 | Emesh | ............... C23C 16/14 257/E21.585 |
| 2016/0351402 A1 | * | 12/2016 | Suzuki | ............. H01L 21/32051 |
| 2019/0035916 A1 | * | 1/2019 | Chiu | ................ H01L 21/28088 |
| 2019/0214296 A1 | * | 7/2019 | Wang | ............... H01L 21/76876 |

* cited by examiner

*Primary Examiner* — Kelly M Gambetta
(74) *Attorney, Agent, or Firm* — Harrity & Harrity, LLP

(57) ABSTRACT

Low-flow tungsten chemical vapor deposition (CVD) techniques described herein provide substantially uniform deposition of tungsten on a semiconductor substrate. In some implementations, a flow of a processing vapor is provided to a CVD processing chamber such that a flow rate of tungsten hexafluoride in the processing vapor results in the tungsten layer being grown at a slower rate than a higher flow rate of the tungsten hexafluoride to promote substantially uniform growth of the tungsten layer. In this way, the low-flow tungsten CVD techniques may be used to achieve similar surface uniformity performance to an atomic layer deposition (ALD) while being a faster deposition process relative to ALD (e.g., due to the lower deposition rate and large quantity of alternating processing cycles of ALD). This reduces the likelihood of defect formation in the tungsten layer while increasing the throughput of semiconductor device processing for the semiconductor substrate (and other semiconductor substrates).

20 Claims, 26 Drawing Sheets

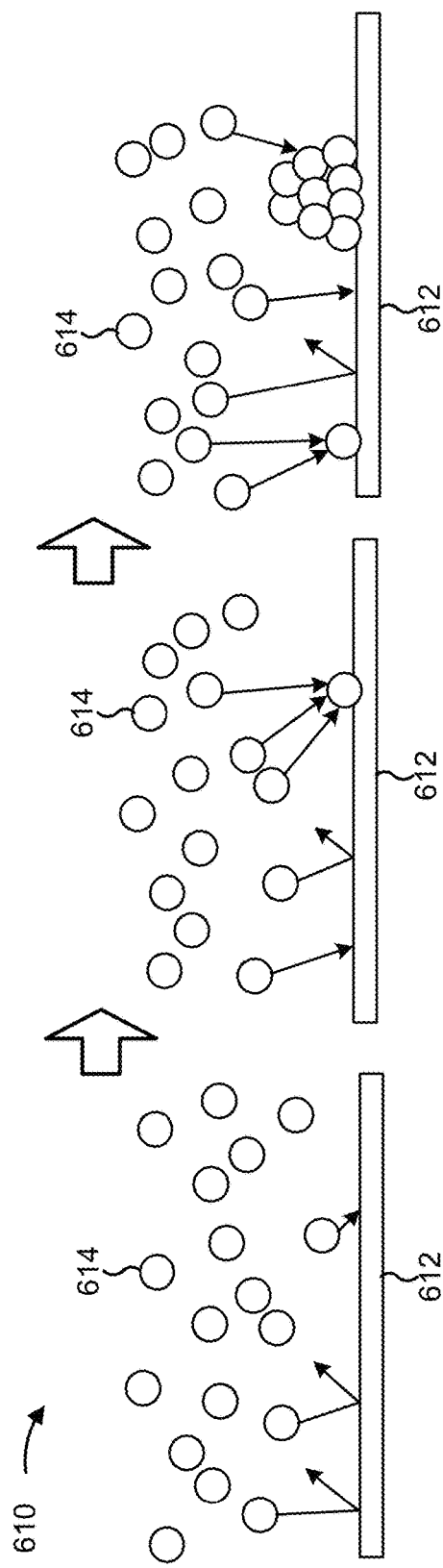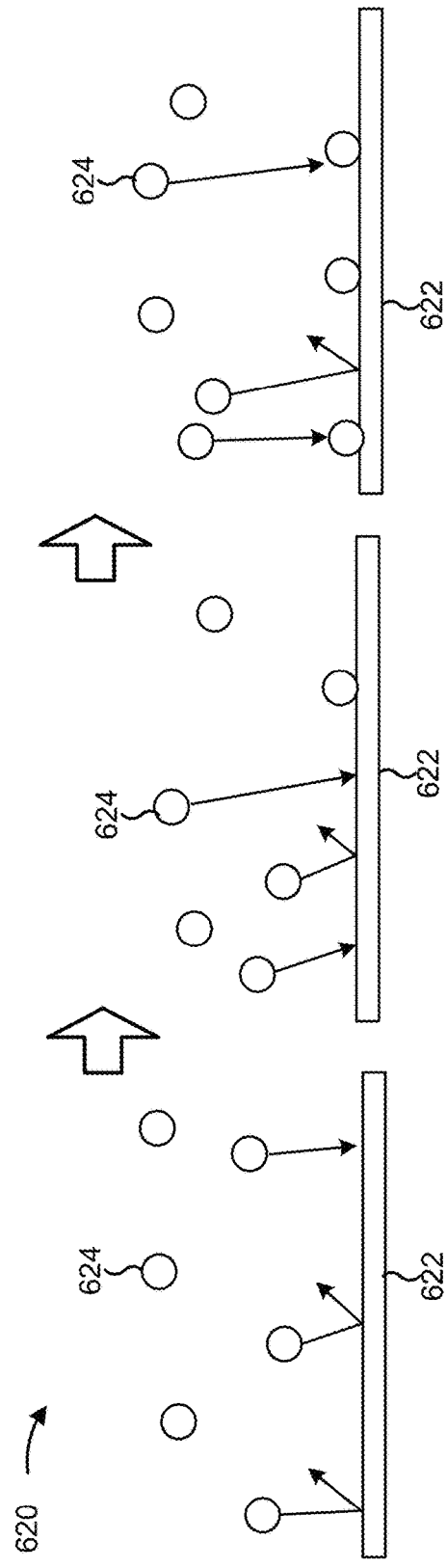
FIG. 6A
FIG. 6B

CHEMICAL VAPOR DEPOSITION FOR UNIFORM TUNGSTEN GROWTH

BACKGROUND

Chemical vapor deposition includes a semiconductor process in which a solid film or layer is deposited onto a semiconductor substrate surface through a chemical reaction of a gas mixture. The semiconductor substrate surface may be heated and/or treated with a plasma to provide additional energy to facilitate the chemical reaction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are diagrams of example chemical vapor deposition (CVD) deposition rates described herein.

DETAILED DESCRIPTION

Figure 1A:
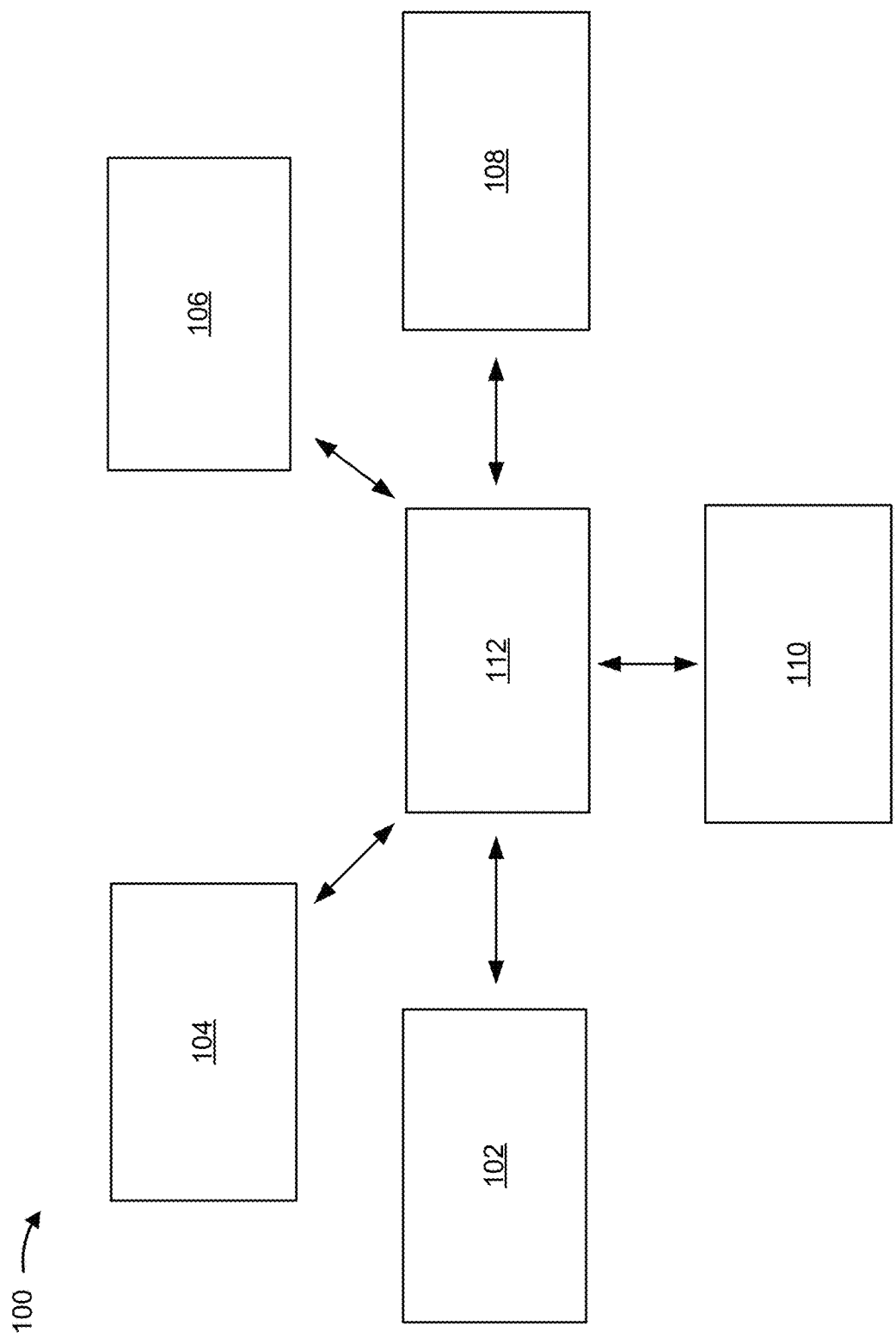
FIGS. 1A and 1B are diagrams of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a chemical vapor deposition (CVD) operation, a material (or a precursor of the material) that is to be deposited onto a semiconductor substrate is carried into a processing chamber by a carrier gas. The combination of the material and the carrier gas is referred to as a processing vapor. The concentration or flow rate of the material in the processing vapor directly affects the growth rate (or deposition rate) of the material onto the semiconductor substrate. In some cases, a tungsten precursor such as tungsten fluoride (e.g., a $WF_x$ such as tungsten hexafluoride ($WF_6$)) may be deposited too quickly (e.g., as a result of a high flow rate or a high concentration in the processing vapor) onto a semiconductor substrate, which can result in poor uniformity of the resulting tungsten layer on the semiconductor substrate. As an example, a high flow of tungsten hexafluoride (which may include, for example, a processing vapor having a ratio of tungsten hexafluoride concentration to a carrier gas of approximately 50:7200 or greater) may result in a root means squared (RMS) surface roughness of approximately 1.6 to approximately 1.9 or greater. This can result in the formation of defects such as voids, discontinuities, pattern loading, and/or island formation in the tungsten layer. These defects may reduce device yield on the semiconductor substrate, may reduce device quality, may increase pattern leakage, and/or may increase the rate of semiconductor substrate scrapping, among other examples.

Some implementations described herein provide low-flow tungsten CVD techniques for uniform deposition of tungsten on a semiconductor substrate. In some implementations described herein, a flow of a processing vapor is provided to a CVD processing chamber such that a flow rate of tungsten hexafluoride in the processing vapor results in the tungsten layer being grown at a slower rate than a higher flow rate of the tungsten hexafluoride to promote substantially uniform growth of the tungsten layer. In this way, the low-flow tungsten CVD techniques described herein may be used to achieve similar surface uniformity performance to an atomic layer deposition (ALD) while being a faster deposition process relative to ALD (e.g., due to the lower deposition rate and large quantity of alternating processing cycles of ALD) and providing increased deposition selectivity relative to ALD. This reduces the likelihood of defect formation in the tungsten layer, increases deposition process flexibility, and/or increases the throughput of semiconductor device processing for the semiconductor substrate (and other semiconductor substrates), among other examples.

Figure 1B:
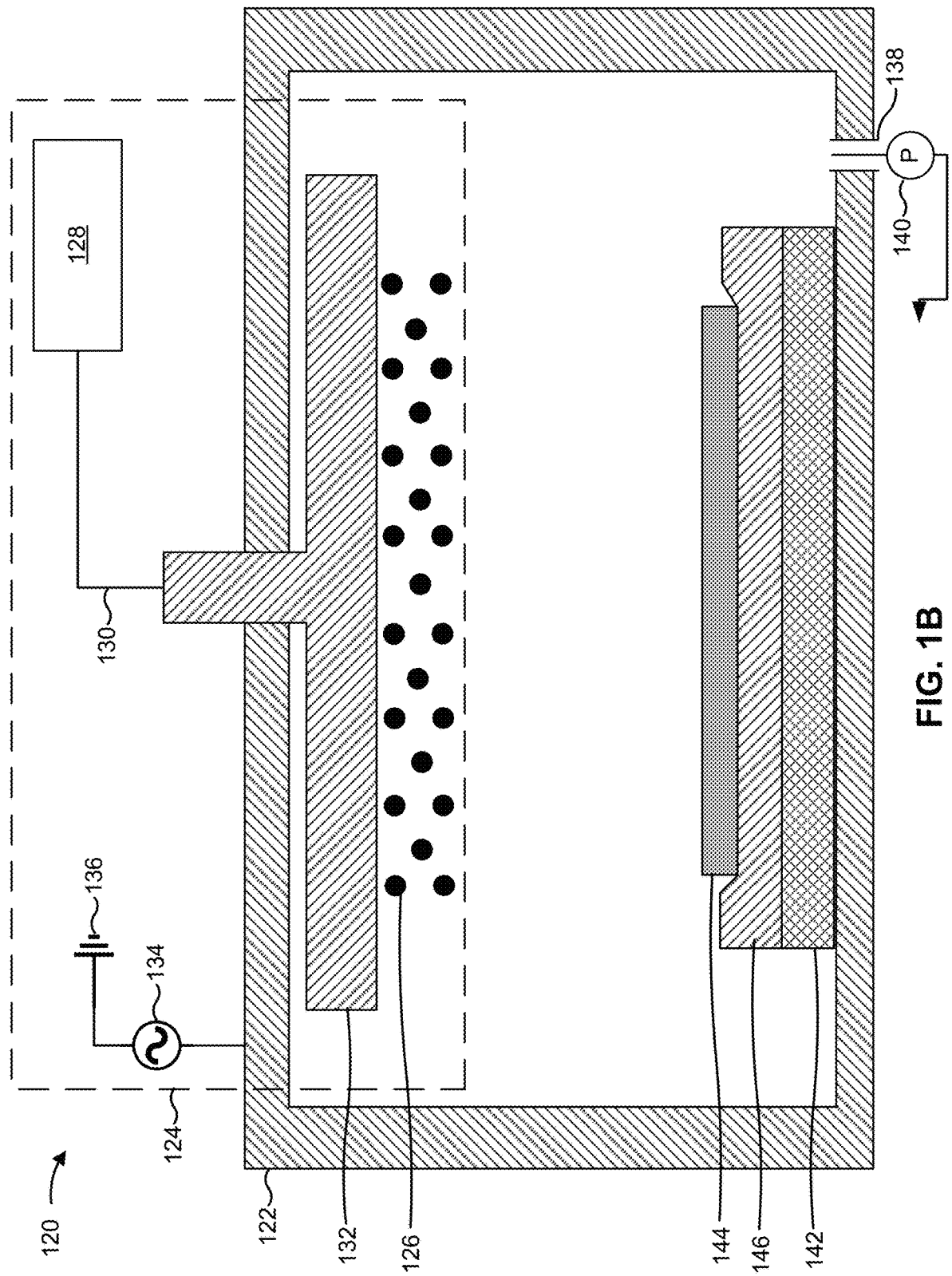

FIGS. 1A and 1B are diagrams of an example environment 100 in which systems and/or methods described herein may be implemented. As shown in FIG. 1A, environment 100 may include a plurality of semiconductor processing tools 102-110 and a wafer/die transport tool 112. The plurality of semiconductor processing tools 102-110 may include a deposition tool 102, an exposure tool 104, a developer tool 106, an etch tool 108, a planarization tool 110, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

Wafer/die transport tool 112 includes a mobile robot, a robot arm, a tram or rail car, an overhead hoist transport (OHT) system, an automated materially handling system (AMHS), and/or another type of device that is used to transport wafers and/or dies between semiconductor processing tools 102-110 and/or to and from other locations such as a wafer rack, a storage room, and/or the like. In some implementations, wafer/die transport tool 112 may be a programmed device that is configured to travel a particular path and/or may operate semi-autonomously or autonomously.

FIG. 1B illustrates an example CVD tool 120, which is an example of a deposition tool 102 included in the environment 100. The CVD tool 120 is configured to perform a low-flow CVD operation described herein to deposit a layer (e.g., a tungsten layer or another type of layer) on a semiconductor substrate. As shown in FIG. 1B, the CVD tool 120 includes a processing chamber 122 (e.g., a CVD processing chamber) and a vapor supply system 124 (e.g., a CVD vapor supply system). The vapor supply system 124 is configured to provide a flow of a processing vapor 126 into the processing chamber 122. The vapor supply system 124 includes a vapor generator 128, which may include a plurality of devices and/or systems that are configured to generate a vapor from a source material (e.g., a solid or liquid source material) and mix the source material with a carrier gas to generate the processing vapor 126. The flow of the processing vapor 126 is provided through a supply line 130 to a showerhead 132 included in the processing chamber 122. The flow of the processing vapor 126 flows through the showerhead 132 and into the processing chamber 122. In some implementations, the vapor supply system 124 includes a plasma source 134 that is connected to an electrical ground 136. The plasma source 134 is configured to generate and provide a plasma to the processing chamber 122 to facilitate a plasma enhanced CVD operation to be performed in the processing chamber 122.

The processing chamber 122 further includes a vent 138 (or port) through which the processing chamber 122 may be purged of oxygen, the processing vapor 126, and/or one or more other gasses in the processing chamber 122. A vacuum pump 140 is included to pump and/or otherwise remove the oxygen, the processing vapor 126, and/or the one or more other gasses from the processing chamber 122 through the vent 138.

In some implementations, the CVD tool 120 includes a heater 142 that is configured to heat a semiconductor substrate 144 on a chuck 146. The semiconductor substrate 144 includes a semiconductor wafer or another type of semiconductor device on which one or more layers are to be formed in a CVD operation. The chuck 146 includes a vacuum chuck, an electrostatic chuck, or another type of chuck that is configured to secure the semiconductor substrate 144 in place during the CVD operation.

The number and arrangement of devices shown in FIGS. 1A and 1B are provided as one or more examples. In practice, there may be additional devices, fewer devices, different devices, or differently arranged devices than those shown in FIGS. 1A and 1B. Furthermore, two or more devices shown in FIGS. 1A and 1B may be implemented within a single device, or a single device shown in FIGS. 1A and 1B may be implemented as multiple, distributed devices. Additionally, or alternatively, a set of devices (e.g., one or more devices) of environment 100 may perform one or more functions described as being performed by another set of devices of environment 100.

Figure 2:
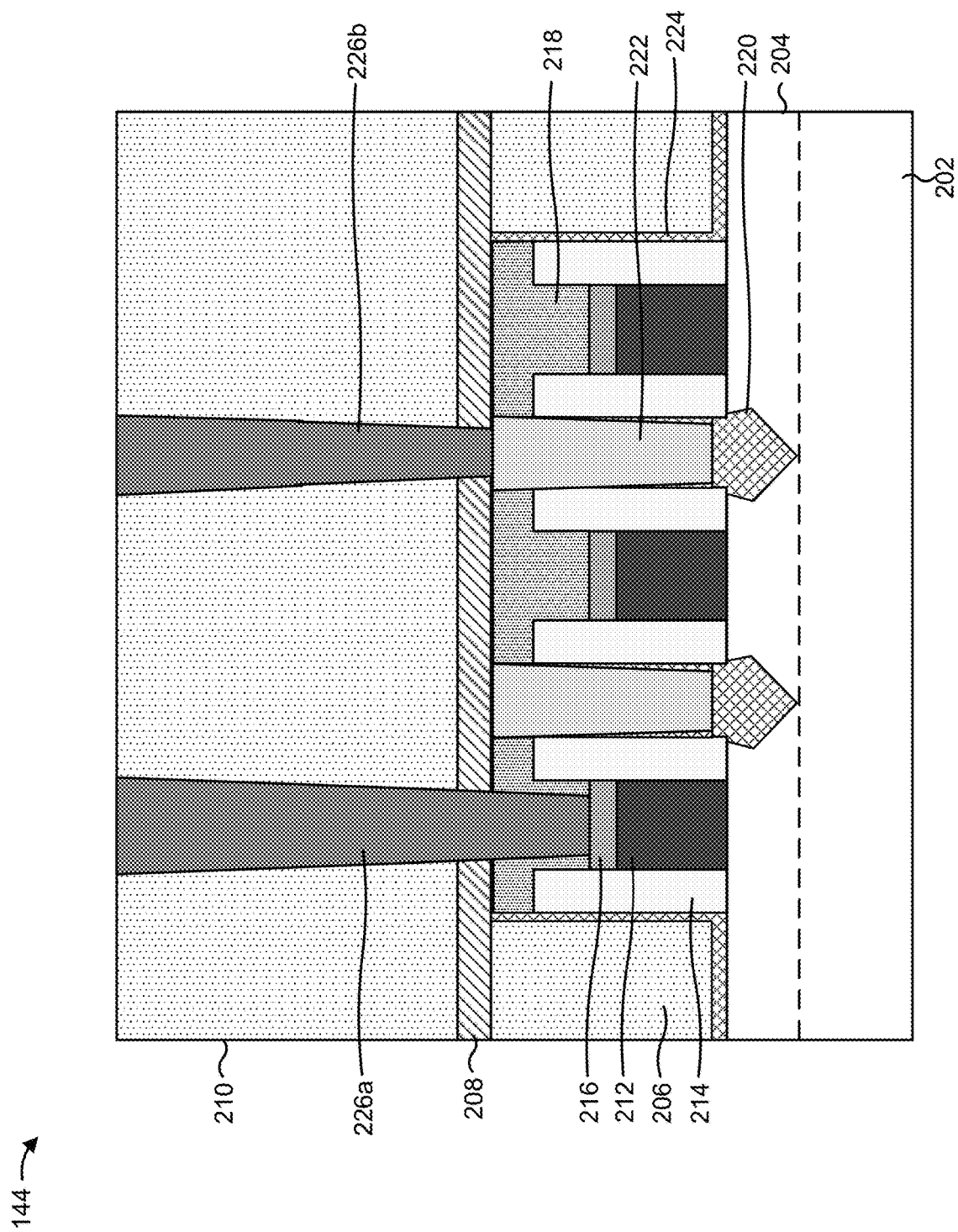
FIG. 2 is a diagram of an example of a portion of a semiconductor substrate described herein.

FIG. 2 is a diagram of a portion of the semiconductor substrate 144 described herein. The portion of the semiconductor substrate 144 includes an example of a memory device (e.g., a static random access memory (SRAM), a dynamic random access memory (DRAM)), a logic device, a processor, an input/output device, or another type of semiconductor device that includes one or more transistors.

As shown in FIG. 2, the semiconductor substrate 144 includes a device substrate 202, which includes a silicon (Si) substrate, a substrate formed of a material including silicon, a III-V compound semiconductor material substrate such as gallium arsenide (GaAs), a silicon on insulator (SOI) substrate, a silicon germanium (SiGe) substrate, or another type of semiconductor substrate. In some implementations, a fin structure 204 is formed in the device substrate 202. In some implementations, a plurality of fin structures 204 are included in the device substrate 202. In this way, the transistors included on the semiconductor substrate 144 include fin field-effect transistors (finFETs). In some implementations, the semiconductor substrate 144 includes other types of transistors, such as gate all around (GAA) transistors (e.g., nanosheet transistors, nanowire transistors), planar transistors, and/or other types of transistors. The fin structures 204 may be electrically isolated by intervening shallow trench isolation (STI) structures (not shown). The STI structures may be etched back such that the height of the STI structures is less than the height of the fin structures 204. In this way, the gate structures of the transistors may be formed around at least three sides of the fin structures 204.

As shown in FIG. 2, a plurality of layers are included on the device substrate 202 and/or on the fin structures 204, including a dielectric layer 206, an etch stop layer (ESL) 208, and a dielectric layer 210, among other examples. The dielectric layers 206 and 210 are included to electrically isolate various structures of the semiconductor substrate 144. The dielectric layers 206 and 210 include interlayer dielectric layers (ILDs). For example, the dielectric layer 206 may include an ILD0 layer, and the dielectric layer 210 may include an ILD1 layer or an ILD2 layer. The dielectric layers 206 and 210 include a silicon nitride ($SiN_x$), an oxide (e.g., a silicon oxide ($SiO_x$) and/or another oxide material), and/or another type of dielectric material. The ESL 208 includes a layer of material that is configured to permit various portions of the semiconductor substrate 144 (or the layers included therein) to be selectively etched or protected from etching to form one or more of the structures included on the device substrate 202.

As further shown in FIG. 2, a plurality of gate stacks may be included over, on, and/or around a portion of the fin structure 204. The gate stacks include a metal gate (MG) structure 212 between sidewall spacers 214, a metal capping layer 216 over and/or on the metal gate structure 212, and a dielectric capping layer 218 over and/or on the metal capping layer 216. The metal gate structures 212 include a conductive metallic material (or metal alloy) such as cobalt (Co), tungsten (W), ruthenium (Ru), copper (Cu), another metallic material, and/or a combination thereof. The sidewall spacers 214 are included to electrically isolate the gate stacks from adjacent conductive structures included on the semiconductor substrate 144. The sidewall spacers 214 include a silicon oxide ($SiO_x$), a silicon nitride ($Si_xN_y$), a silicon oxy carbide (SiOC), a silicon oxycarbonitride (SiOCN), and/or another suitable material.

The metal capping layer 216 is included to protect the metal gate structure 212 from oxidization and/or etch damage during processing of the semiconductor substrate 144, which preserves the low contact resistance of the metal gate structure 212. The metal capping layer 216 includes a conductive metallic material (or metal alloy) such as cobalt (Co), tungsten (W), ruthenium (Ru), copper (Cu), another metallic material, and/or a combination thereof. The dielectric capping layer 218 includes a dielectric material such as a silicon nitride ($SiN_x$), an oxide (e.g., a silicon oxide ($SiO_x$) and/or another oxide material), and/or another type of dielectric material. The dielectric capping layer 218 may be referred to as a sacrificial (SAC) layer that protects the gate stacks from processing damage during processing of the semiconductor substrate 144.

As further shown in FIG. 2, a plurality of source/drain regions 220 are included on and/or around portions of the fin structure 204. The source/drain regions 220 include p-doped and/or n-doped epitaxial (epi) regions that are grown and/or otherwise formed by epitaxial growth. In some implementations, the source/drain regions 220 are formed over etched portions of the fin structure 204. The etched portions may be formed by strained source drain (SSD) etching of the fin structure 204 and/or another type etching operation.

Metal source/drain contacts (MDs) 222 are included over and/or on the source/drain regions 220. In some implementations, a metal silicide layer (not shown) is included between the source/drain regions 220 and the metal source/drain contacts 222. The metal silicide layer may be included to decrease contact resistance between the source/drain regions 220 and the metal source/drain contacts 222 and/or to decrease the Schottky barrier height (SBH) between the source/drain regions 220 and the metal source/drain contacts 222. The metal source/drain contacts 222 include conductive metallic material (or metal alloy) such as cobalt (Co), tungsten (W), ruthenium (Ru), copper (Cu), another metallic material, and/or a combination thereof.

In some implementations, a contact etch stoper layer (CESL) 224 is included between the sidewalls spacers of the gate stacks and the metal source/drain contacts 222. The CESL 224 may be included to provide etch selectivity or etch proception for the sidewall spacers 214 during an etch operation to form openings in which the metal source/drain contacts 222 are formed.

As further shown in FIG. 2, the metal gate structures 212 (e.g., either directly or via the metal capping layer 216) and the metal source/drain contacts 222 are electrically connected to interconnect structures. For example, a metal gate structure 212 may be electrically connected to a gate interconnect structure 226a (e.g., a gate via or VG). The metal gate structure 212 may be electrically connected to the gate interconnect structure 226a directly, via the intervening metal capping layer 216, and/or by a metal gate contact (MP). As another example, a metal source/drain contact 222 may be electrically connected to a source/drain interconnect structure 226b (e.g., a source/drain via or VD). The interconnect structures (e.g., the gate interconnect structure 226a, the source/drain interconnect structure 226b, among other examples) electrically connect the transistors on the semiconductor substrate 144 and/or electrically connect the transistors to other areas and/or components of the semiconductor substrate 144. In some implementations, the interconnect structures electrically connect the transistors to a back end of line (BEOL) region of the semiconductor substrate 144. The gate interconnect structure 226a and the source/drain interconnect structure 226b include a conductive material such as tungsten, cobalt, ruthenium, copper, and/or another type of conductive material.

As indicated above, FIG. 2 is provided as an example. Other examples may differ from what is described with regard to FIG. 2.

FIGS. 3A-3F are diagrams of an example implementation 300 described herein. The example implementation 300 includes an example of forming one or more layers and/or structures on the semiconductor substrate 144. In particular, the example implementation 300 includes an example dummy gate replacement process in which dummy gate structures 302 on the semiconductor substrate 144 are removed and replaced with the gate stacks (e.g., metal gate stacks) illustrated and described herein in connection with FIG. 2.

Figure 3A:
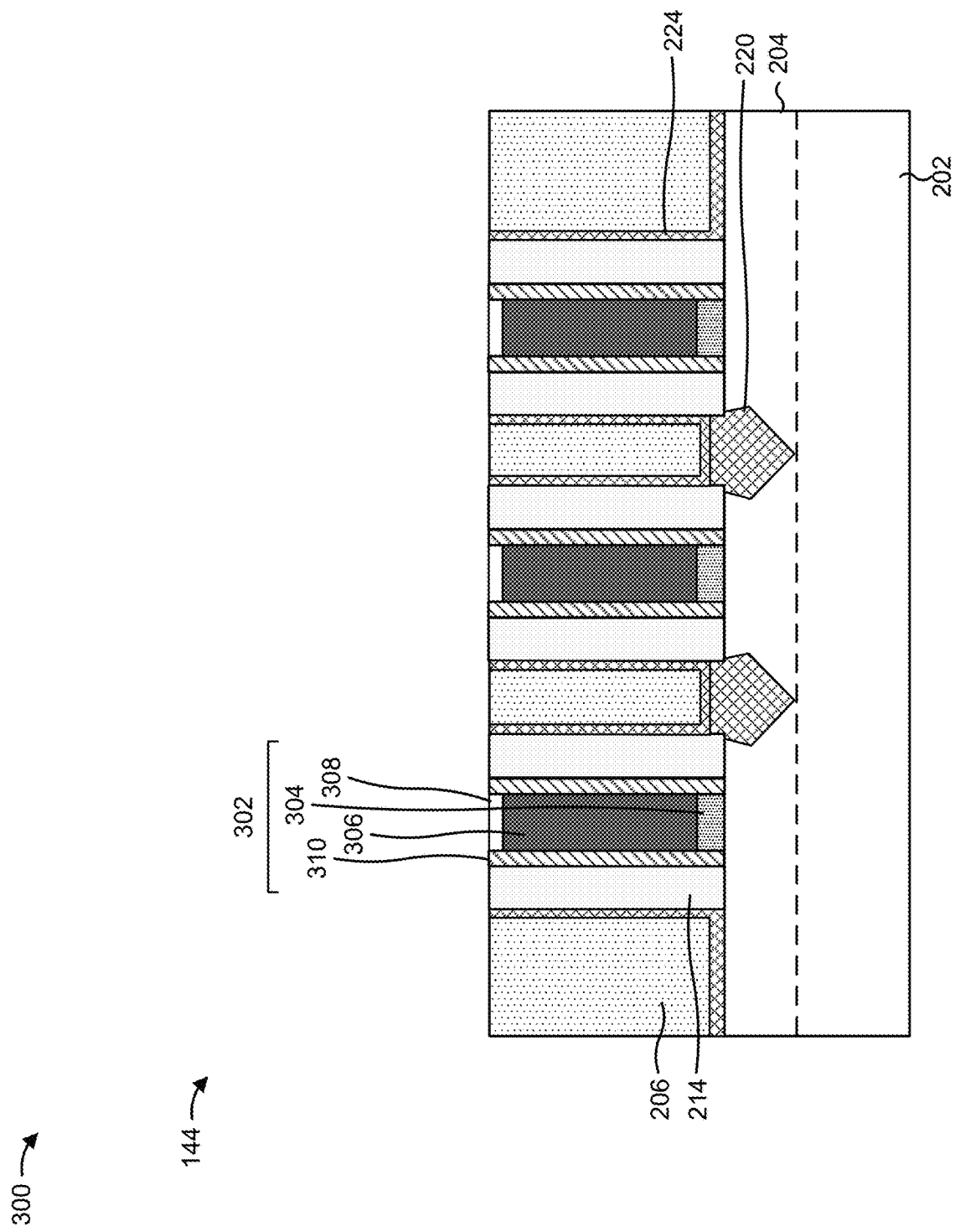
FIGS. 3A-3F, 4A-4E, and 5A-5E are diagrams of examples implementations described herein.

As shown in FIG. 3A, dummy gate structures 302 are included between source/drain regions 220 and between areas of the dielectric layer 206. Moreover, the dummy gate structures 302 are formed and included over the fin structure 204, and around the sides of the fin structure 204 such that the dummy gate structures 302 surround the fin structure 204 on three sides of the fin structure 204. The dummy gate structures 302 are formed as a placeholder for the actual gate structures (e.g., replacement high-k gate or metal gate) that are to be formed for the transistors included on the semiconductor substrate 144.

The dummy gate structures 302 include a gate dielectric layer 304, a gate electrode layer 306, and a hard mask layer 308. The gate dielectric layer 304 may include a dielectric oxide layer. As an example, the gate dielectric layer 304 may be formed by chemical oxidation, thermal oxidation, ALD, CVD, and/or another suitable method. The gate electrode layer 306 may include a polysilicon layer or another suitable layer. For example, the gate electrode layer 306 may be formed by a suitable deposition process such as a low-pressure chemical vapor deposition (LPCVD) and PECVD. The hard mask layer 308 may include any material suitable to pattern the gate electrode layer 306 with a desired feature/dimension on the semiconductor substrate 144. Example materials for the hard mask layer 308 include silicon nitride, silicon oxynitride, silicon carbon nitride, the like, or a combination thereof, deposited by CVD, PVD, ALD, or another deposition technique.

As further shown in FIG. 3A, seal spacers 310 are included on the sidewalls of the dummy gate structures 302. The seal spacers 310 may be conformally deposited (e.g., by the deposition tool 102) and may include a silicon oxycarbide (SiOC), a nitrogen free SiOC, or another suitable material. The seal spacers 310 may be formed by an ALD operation in which various types of precursor gasses including silicon (Si) and carbon (C) are sequentially supplied in a plurality of alternating cycles to form the seal spacers 310.

The cycles of the ALD operation include alternating flows (or pulses) and purge operations, where each precursor is flowed (or pulsed) and subsequently purged at least once during a cycle. For example, silicon and carbon source precursor is flowed in an ALD tool chamber into which the semiconductor substrate 144 is transferred, and subsequently, the silicon and carbon source precursor is purged from the ALD tool chamber. In some examples, the silicon and carbon source precursor may react with reaction sites available on the semiconductor substrate 144 before being purged. The reactions may saturate the reaction sites, or the silicon and carbon source precursor may not react with some reaction sites available on the semiconductor substrate 144, in some examples. After the silicon and carbon source precursor is purged, an oxygen source precursor is then flowed in the ALD tool chamber, and subsequently, the oxygen source precursor is purged from the ALD tool chamber. Similarly, in some examples, the oxygen source precursor may react with reaction sites available on the semiconductor substrate 144 before being purged. The reactions may saturate the reaction sites, or the oxygen source precursor may not react with some reaction sites available on the semiconductor substrate 144, in some examples. The cycles of the pulses and the purges between the alternating silicon and carbon source precursor and the oxygen source precursor may be performed any number of times until a desired thickness of the seal spacers 310 is achieved.

In some implementations, the seal spacers 310 are treated using a plasma. The plasma surface treatment process may efficiently incorporate certain elements to react with the unsaturated bonds in the seal spacers 310 so as to improve the bonding energy and densify the film structure to treat the seal spacers 310 with relatively high film density. The higher film density resulting from treatment of the seal spacers 310 may prevent the interface and the film stack subsequently formed thereon from plasma damage during the dummy gate removal process. Furthermore, the treatment process may also be performed to modify the morphology and/or surface roughness of the surface of the seal spacers 310 to improve the adhesion and robustness.

As further shown in FIG. 3A, the sidewalls spacers 214 (which may be referred to as bulk spacer layers) may be formed on the seal spacers 310. The sidewall spacers 214 may be formed of similar materials as the seal spacers 310. However, the sidewall spacers 214 may be formed without the plasma surface treatment that is used for the seal spacers 310. Moreover, the sidewall spacers 214 may be formed to a greater thickness relative to the thickness of the seal spacers 310.

The seal spacers 310 and the sidewall spacers 214 may be conformally deposited on the dummy gate structures 302, respectively, and on the fin structure 204. The seal spacers 310 and the sidewall spacers 214 are then patterned and etched to remove the seal spacers 310 and the sidewall spacers 214 from the tops of the dummy gate structures 302, and from the fin structures 204. The CESL 224 may be conformally deposited over the fin structure 204, over source/drain regions 220, over the dummy gate structures 302, and on the sidewalls of the sidewall spacers 214. The dielectric layer 206 is formed over and/or on the CESL 224. The dielectric layer 206 fills in the areas between the dummy gate structures 302 over the source/drain regions 220. The dielectric layer 206 and the CESL 224 may then be planarized (e.g., by the planarization tool 110) to remove the dielectric layer 206 and the CESL 224 from the tops of the dummy gate structures 302.

Figure 3B:
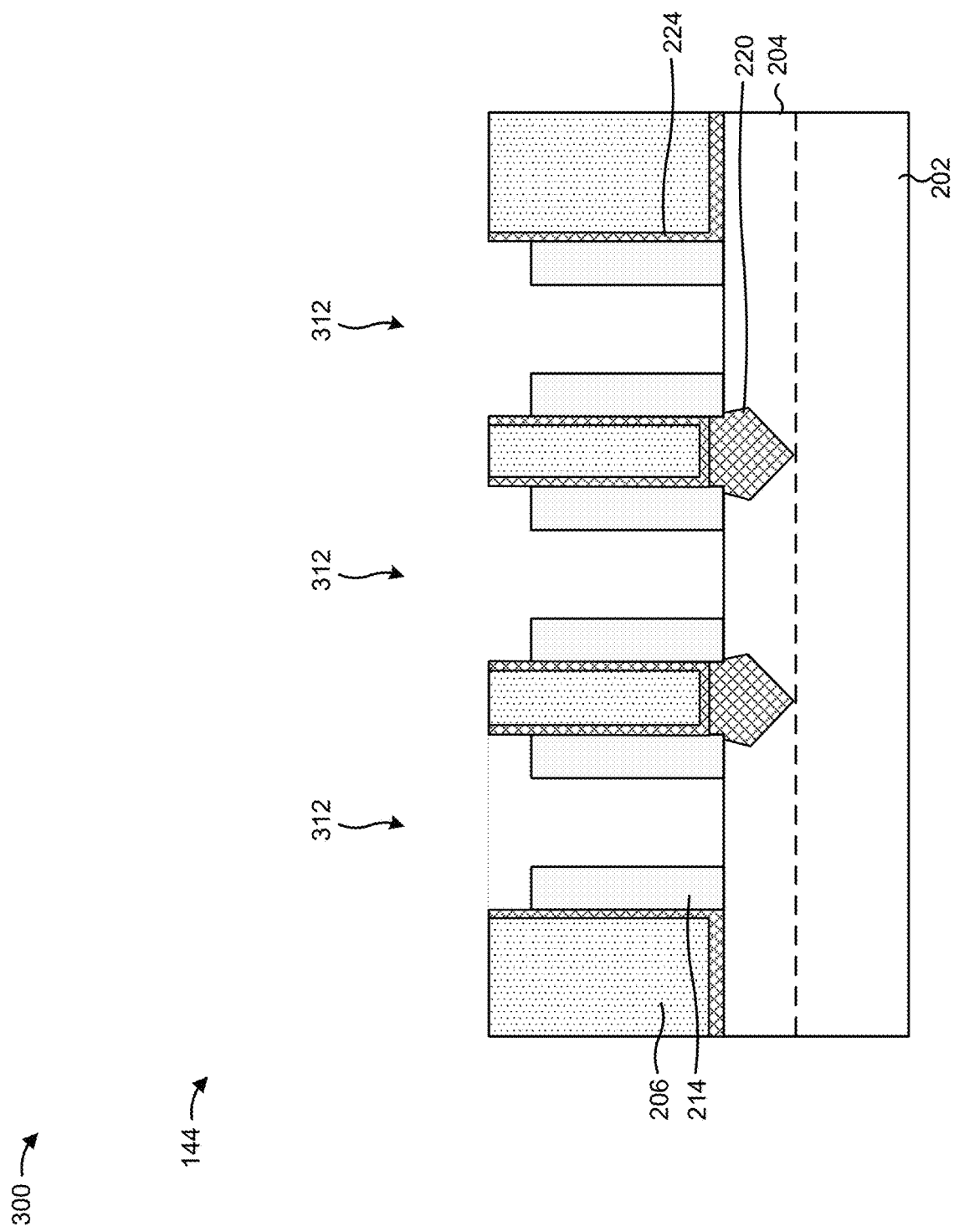

As shown in FIG. 3B, the dummy gate structures 302 are removed from the semiconductor substrate 144 as part of the dummy gate replacement process. The removal of the dummy gate structures 302 leaves behind openings 312 between the sidewalls spacers 214 where the dummy gate structures 302 were removed. In some implementations, a pattern in a photoresist layer may be used to etch the dummy gate structures 302 to remove the dummy gate structures 302. In these implementations, a spin-coating tool (e.g., a type of deposition tool 102) forms the photoresist layer on the dummy gate structures 302 and on the dielectric layer 206. The exposure tool 104 exposes the photoresist layer to a radiation source to pattern the photoresist layer. The developer tool 106 develops and removes portions of the photoresist layer to expose the pattern. The etch tool 108 etches the dummy gate structures 302 based on the pattern to remove the dummy gate structures 302. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for removing the dummy gate structures 302 based on a pattern. In some implementations, the etch operation to remove the dummy gate structures 302 may result in a portion of the sidewall spacers 214 being etched or removed, as shown in the example in FIG. 3B.

Figure 3C:
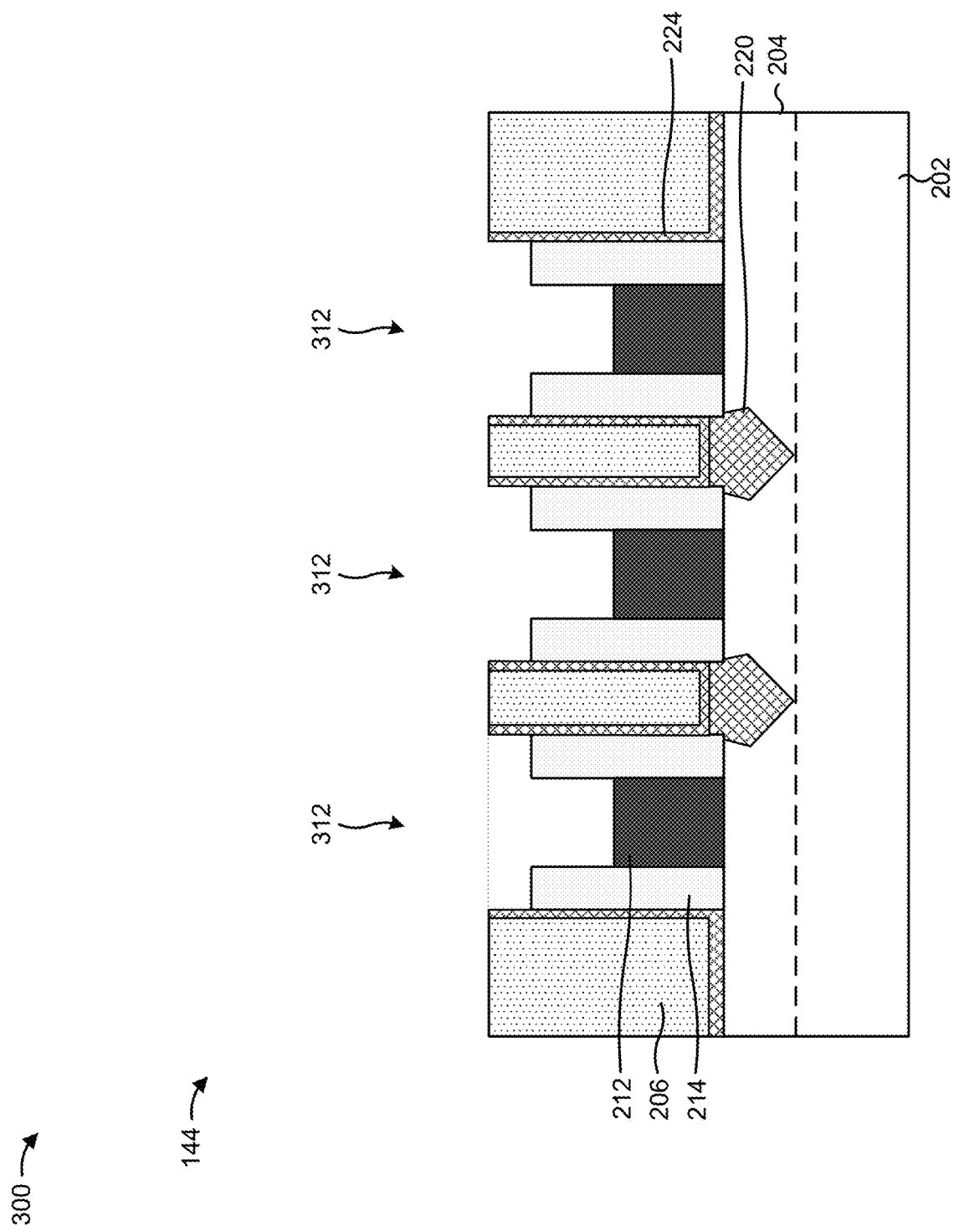

As shown in FIG. 3C, the metal gate structures 212 are formed in the openings 312 between the sidewall spacers 214 and over and/or on the fin structure 204. The metal gate structures 212 may be formed by a CVD operation, an ALD operation, an electroplating operation, and/or another deposition technique. In some implementations, the metal gate structures 212 are formed to thickness that occupies a portion of the height of the openings 312. In some implementations, the metal gate structures 212 are formed to the full height of the openings 312 and then etched back (e.g., by the etch tool 108) to a thickness that occupies a portion of the height of the openings 312. In some implementations, the metal gate structures 212 are planarized (e.g., by the planarization tool 110) prior to the etch back operation.

Figure 3D:
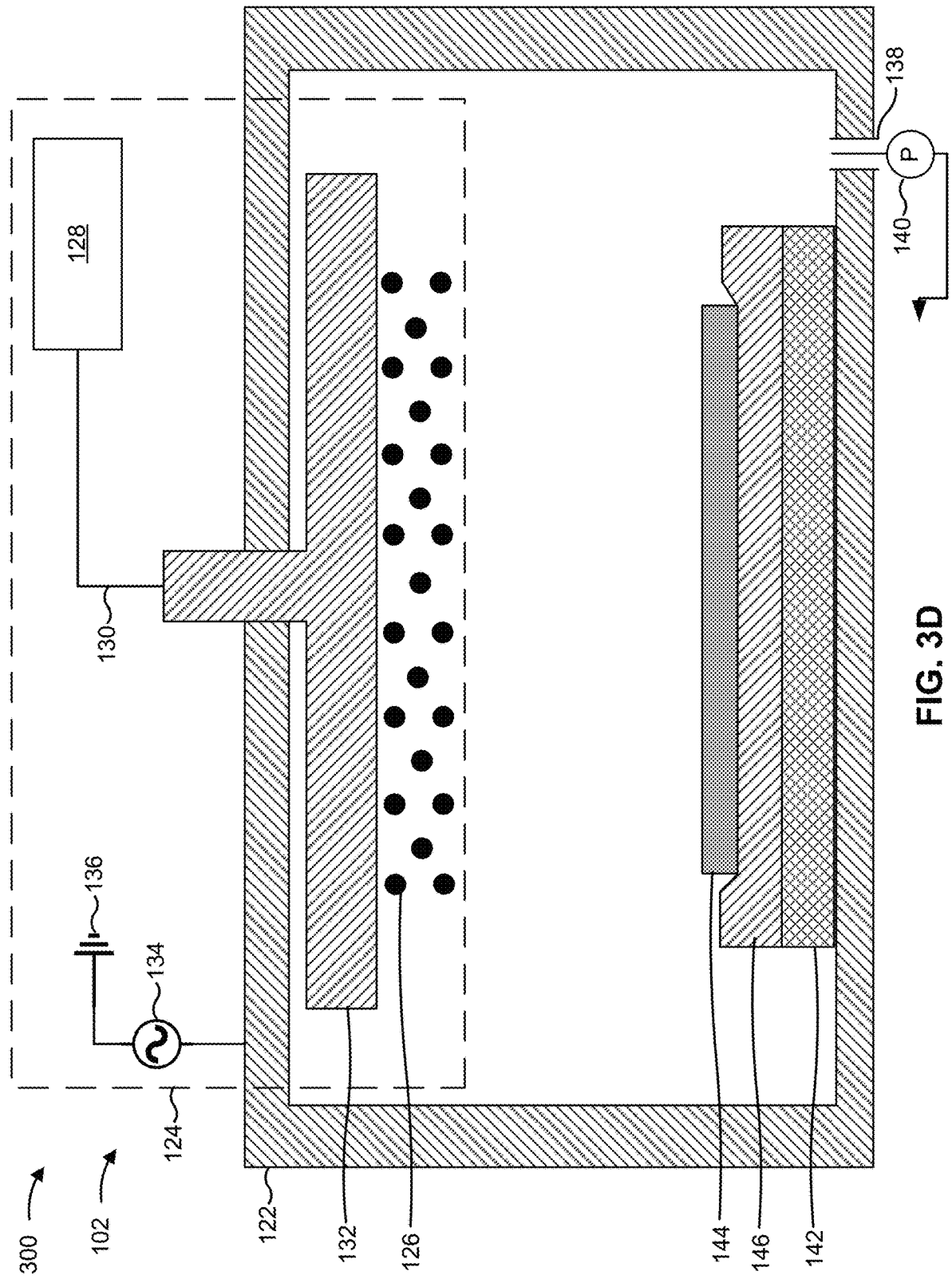

As shown in FIG. 3D, the semiconductor substrate 144 is positioned in the processing chamber 122 (e.g., the CVD processing chamber) of the CVD tool 120 such that a CVD operation may be performed to form the metal capping layer 216 over and/or on the metal gate structures 212. The semiconductor substrate 144 may be positioned on the chuck 146 and secured to the chuck 146 (e.g., by a vacuum, an electrostatic force, or another clamping force). The vapor supply system 124 (e.g., the CVD vapor supply system) generates a flow of a processing vapor 126 and provides the flow of the processing vapor 126 into the processing chamber 122 through the showerhead 132. The metal capping layer 216 may be formed to include a tungsten layer. Accordingly, the flow of the processing vapor 126 includes a tungsten precursor such as tungsten hexafluoride ($WF_6$) or another tungsten fluoride ($WF_x$) and a carrier gas that carriers the tungsten hexafluoride into the processing chamber 122 through the showerhead 132.

In some implementations, the carrier gas may include argon (Ar), nitrogen ($N_2$), and/or another inert gas. In some implementations, the carrier gas includes a reactant gas such as hydrogen ($H_2$). Alternatively, the tungsten hexafluoride may be carried into the processing chamber 122 by an inert carrier gas, and a separate reactant gas of hydrogen (or another reactant gas) may be provided into the processing chamber 122. The hydrogen in the carrier gas (or the reactant gas) reacts with the tungsten hexafluoride to form the tungsten layer (the metal capping layer 216). As an example, a reaction between the tungsten hexafluoride and the hydrogen during the CVD operation includes:

$$WF_6 + 3H_2 \rightarrow W + 6HF$$

and results in the fluorine in the tungsten hexafluoride bonding with the hydrogen to form a hydrofluoric acid (HF) as a by-product, and the tungsten being deposited onto the metal gate structures 212. The vacuum pump 140 pumps and/or otherwise removes the hydrofluoric acid from the processing chamber 122 through the vent 138.

The CVD operation may include a selective deposition operation in which the tungsten is deposited onto the underlying metal layer (e.g., the metal gate structures 212) and resists deposition onto the dielectric sidewalls of the sidewall spacers 214. In this way, the metal capping layer 216 is deposited in a bottom-up deposition technique in which the thickness of the tungsten layer of the metal capping layer 216 grows or increases as a result of deposition onto the metal gate structures 212 and not because of growth on the sidewall spacers 214 (which might otherwise occur in an ALD operation).

In some implementations, the metal capping layer 216 is formed to a width that is in a range of approximately 20 nanometers to approximately 300 nanometers. In some implementations, the metal capping layer 216 is formed to a width that is in a range of approximately 500 nanometers to approximately 1500 nanometers. In some implementations, the metal capping layer 216 is formed to a width that is in a range of approximately 10 nanometers to approximately 40 nanometers. In some implementations, the metal capping layer 216 is formed to another width. In some implementations, the metal capping layer 216 is formed to a height or thickness that is in a range of approximately 3 nanometers to approximately 20 nanometers to achieve continuity of the metal capping layer 216 and to minimize the likelihood of void formation in the metal capping layer 216. In some implementations, the metal capping layer 216 is formed to another height or thickness.

In some implementations, a ratio between a first width (e.g., an x-axis width) and a second width (e.g., a y-axis width) of the metal capping layer 216 is in a range of approximately 1:30 to approximately 2:1. In some implementations, a ratio between a first width (e.g., an x-axis width) and a second width (e.g., a y-axis width) of the metal capping layer 216 is in a range of approximately 1:150 to approximately 2:25. In some implementations, a ratio between a width (e.g., an x-axis width) and a height thickness (e.g., a z-axis dimension) of the metal capping layer 216 is in a range of approximately 40:3 to approximately 1:2. In some implementations, a ratio between a width (e.g., a y-axis width) and a height thickness (e.g., a z-axis dimension) of the metal capping layer 216 is in a range of approximately 100:1 to approximately 10:1. In some implementations, a ratio between a width (e.g., a y-axis width) and a height thickness (e.g., a z-axis dimension) of the metal capping layer 216 is in a range of approximately 500:1 to approximately 25:1.

The CVD operation to deposit the metal capping layer 216 includes performing a low-flow CVD operation to promote substantially uniform growth of the metal capping layer 216 (e.g., the tungsten layer). The low-flow CVD operation includes providing the flow of the processing vapor 126 such that the flow rate or concentration of the tungsten hexafluoride in the flow of the processing vapor 126 results in increased uniformity control over the growth of the metal capping layer 216 relative to a higher flow rate or concentration. In some implementations, the flow rate of the tungsten hexafluoride in the flow of the processing vapor 126 is in a range of approximately 1 standard cubic centimeter per minute (SCCM) to approximately 10 SCCM to achieve a surface uniformity performance for the CVD operation that is approximately equal to a surface uniformity performance for an ALD operation (e.g., an alternative ALD operation to form the metal capping layer 216). However, other values for the flow rate are within the scope of the present disclosure.

Moreover, the concentration of the tungsten hexafluoride in the flow of the processing vapor 126 may be less for the low-flow CVD operation relative to a concentration of the tungsten hexafluoride in a "high-flow" CVD operation. The lesser concentration of the tungsten hexafluoride in the flow of the processing vapor 126 may be less for the low-flow CVD operation results in the tungsten layer being grown at a slower rate in the low-flow CVD operation than a higher flow rate of the tungsten hexafluoride in the high-flow CVD operation to promote substantially uniform growth of the metal capping layer 216 (e.g., the tungsten layer). In some implementations, the ratio of the tungsten hexafluoride to the carrier gas (the ratio of the flow rate of the tungsten hexafluoride to the flow rate of the carrier gas) in the flow of the processing vapor 126 for the low-flow CVD operation is in a range of approximately 1:7200 to approximately 10:5400 to achieve high surface uniformity for the metal capping layer 216, whereas the ratio of the tungsten hexafluoride to the carrier gas for the high-flow CVD operation may be 50:7200 or greater. However, other values for the ratio of tungsten hexafluoride to the carrier gas for the low-flow CVD operation described herein are within the scope of the present disclosure. As a result of the lesser concentration of the tungsten hexafluoride in the flow of the processing vapor 126, the time duration for the low-flow CVD operation (e.g., to achieve the appropriate thickness for the metal capping layer 216) is greater relative to the time duration for the high-flow CVD operation. As an example, the time duration for the low-flow CVD operation may be in a range of approximately 40 seconds to approximately 100 seconds to achieve the approximate thickness for the metal capping layer 216, whereas the time duration for the high-flow CVD operation may be in a range of approximately 20 seconds to approximately 50 seconds to achieve a similar thickness.

In this way, the concentration in the tungsten hexafluoride is configured to reduce island formation and pattern loading (the variation in growth rate of the metal capping layer 216 across a plurality of semiconductor substrates) in the metal capping layer 216. Moreover, the concentration in the tungsten hexafluoride is configured to reduce the grain size of the metal capping layer 216 relative to the high-flow CVD operation. As an example, the concentration in the tungsten hexafluoride that is configured to reduce the grain size of the metal capping layer 216 for the low-flow CVD operation may be configured to achieve a grain size of approximately 130 nanometers or lower, whereas the grain size achievable with the high-flow CVD operation may be 170 nanometers grain size or greater. However, other values for the grain size of the metal capping layer 216 are within the scope of the present disclosure. In addition, the concentration of the tungsten hexafluoride for the low-flow CVD operation may be configured to achieve a lower fluorine concentration in the metal capping layer 216 (and the underlying metal layer, such as the metal gate structure 212) relative to the high-flow CVD operation. For example, the fluorine concentration in the metal capping layer 216 resulting from the lower concentration of the tungsten hexafluoride for the low-flow CVD operation may be in a range of approximately 100 arbitrary units (a.u.) to approximately 10000 arbitrary units, whereas the high-flow CVD operation may achieve a fluorine concentration of approximately 50000 arbitrary units or more. However, other values for the fluorine concentration in the metal capping layer 216 are within the scope of the present disclosure. In this way, the lower fluorine concentration in the metal capping layer 216 reduces damage to the metal gate structure 212 caused by the fluorine in the tungsten hexafluoride and/or reduces the impact of the fluorine in the tungsten hexafluoride on the resistivity between the metal capping layer 216 and the metal gate structure 212.

Moreover, the flow rate (or concentration) of tungsten hexafluoride for the low-flow CVD operation described herein enables the low-flow CVD operation to achieve similar surface uniformity performance as ALD while providing a relatively faster deposition operation than ALD. For example, the low-flow CVD operation may be achieve a surface roughness for the metal capping layer 216 that is in a range of approximately 0.9 RMS roughness to approximately 1.2 RMS roughness, which is comparable to ALD and less than the high-flow rate CVD operation described above (which may achieve a surface roughness that is in a range of approximately 1.6 RMS roughness to approximately 1.9 RMS roughness, for example). As another example, the low-flow CVD operation may achieve a deposition rate of approximately 3 angstroms per second, and may form the metal capping layer 216 in a single deposition cycle, whereas an alternative ALD operation may involve a plurality of cycles (e.g., 10 or more cycles) to form the metal capping layer 216 in which the deposition rate is approximately 1 angstrom per second. Moreover, the use of a CVD technique in the low-flow CVD operation provides greater deposition selectivity between metals and dielectrics relative to the alternative ALD operation, which may reduce the likelihood of void formation in the metal capping layer 216 and enables the use of the low-flow CVD operation for selective deposition processes.

Figure 3E:
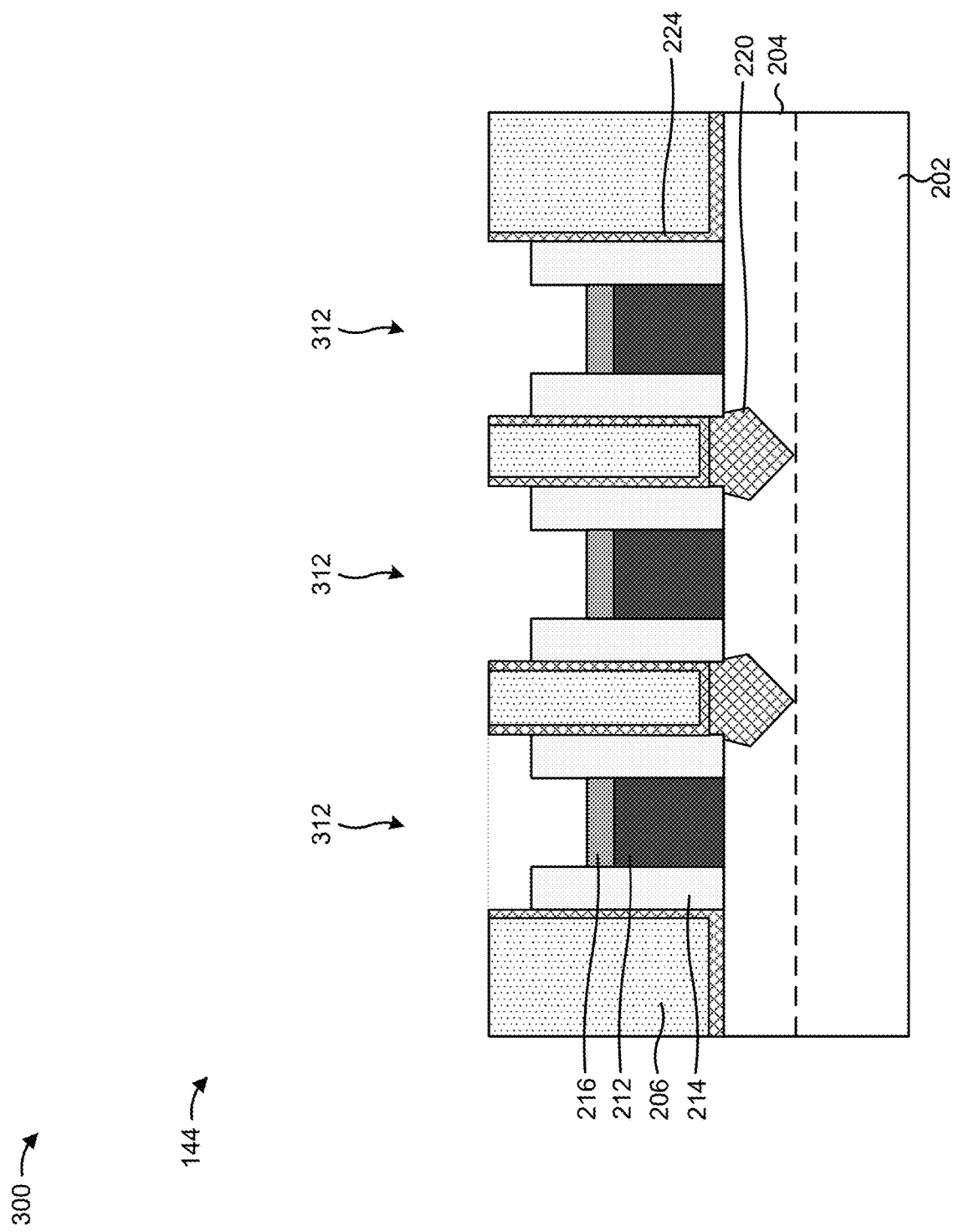

FIG. 3E illustrates the deposited metal capping layers 216 on the metal gate structures 212 in the openings 312, as formed by the low-flow CVD operation described above.

Figure 3F:
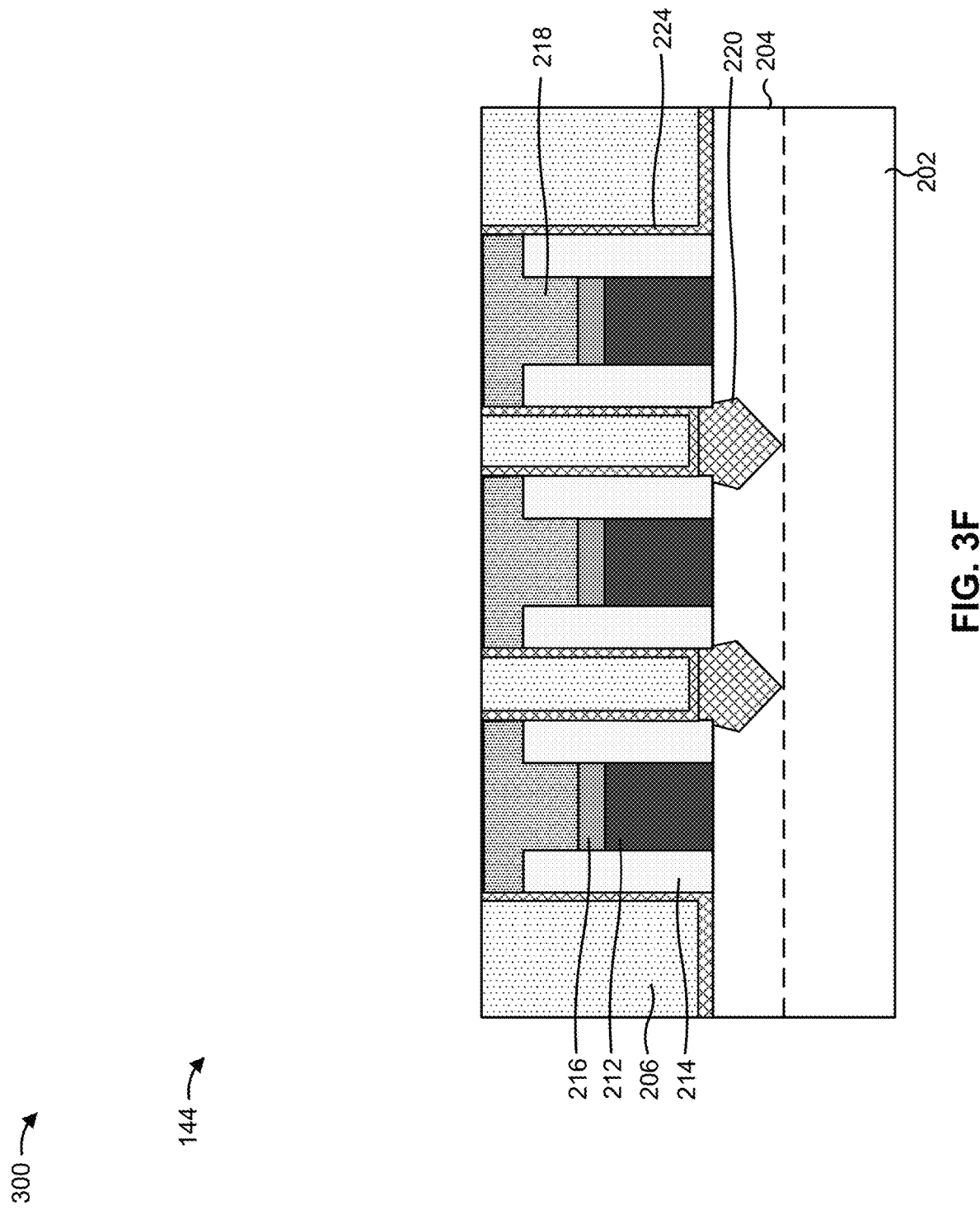

As shown in FIG. 3F, the dielectric capping layers 218 are formed over and/or on the metal capping layers 216. The dielectric capping layers 218 may be formed by a deposition operation (e.g., performed by a deposition tool 102) such as CVD, PVD, ALD, and/or another deposition operation.

As indicated above, FIGS. 3A-3F are provided as an example. Other examples may differ from what is described with regard to FIGS. 3A-3F. In some implementations, the operations and/or techniques described in connection with FIGS. 3A-3F may be used to form a metal capping layer on a metal source/drain contact 222.

FIGS. 4A-4E are diagrams of an example implementation 400 described herein. The example implementation 400 includes an example of forming one or more layers and/or structures on the semiconductor substrate 144. In particular, the example implementation 400 includes a process in which metal source/drain contacts 222 are formed over and/or on the source/drain regions 220 of the semiconductor substrate 144. Turning FIG. 4A, one or more operations described in connection with FIGS. 3A-3F may be performed to form the metal gate structures 212, the metal capping layers 216, the dielectric capping layers 218, the dielectric layer 206, and/or the CESL 224.

Figure 4A:
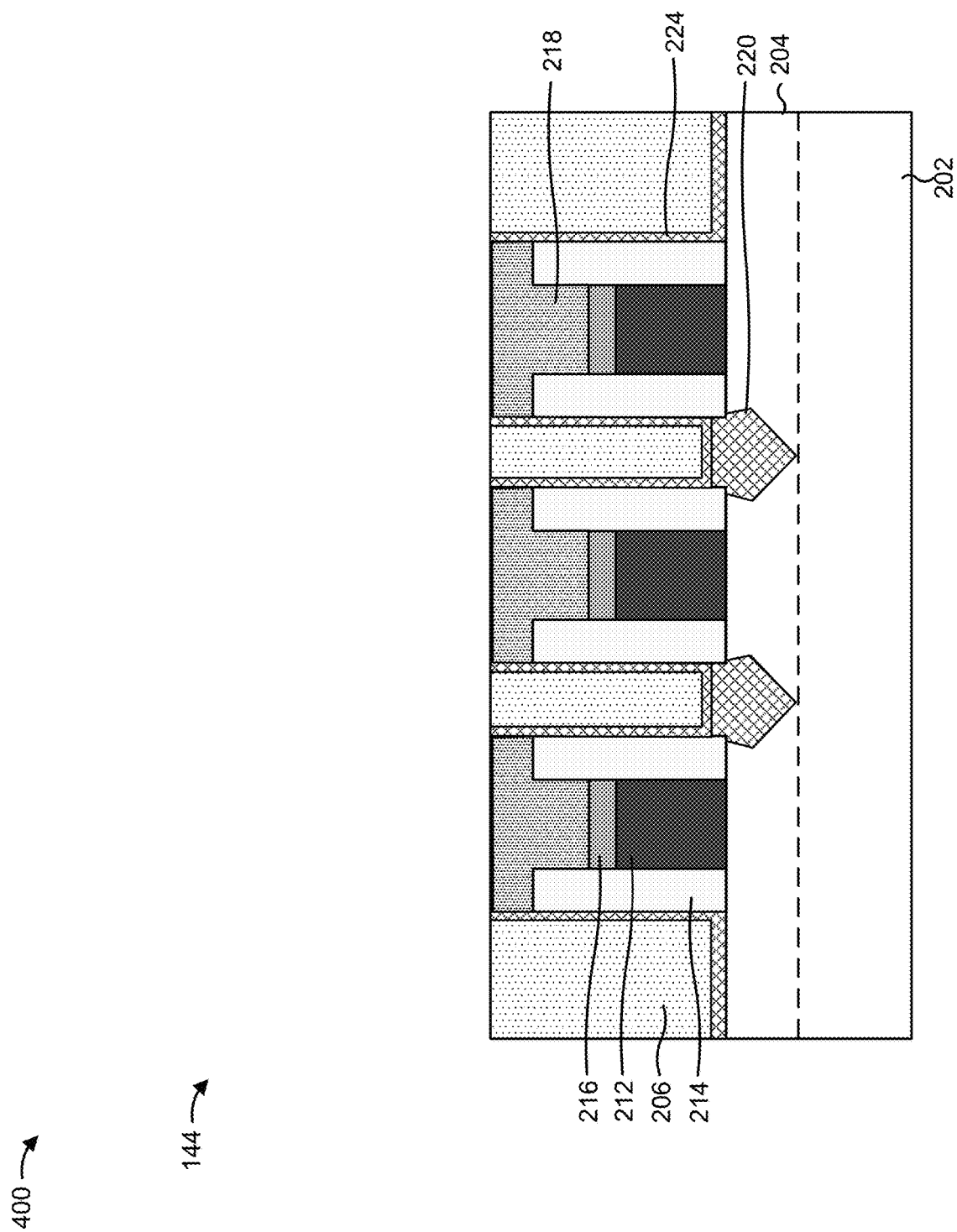
Figure 4B:
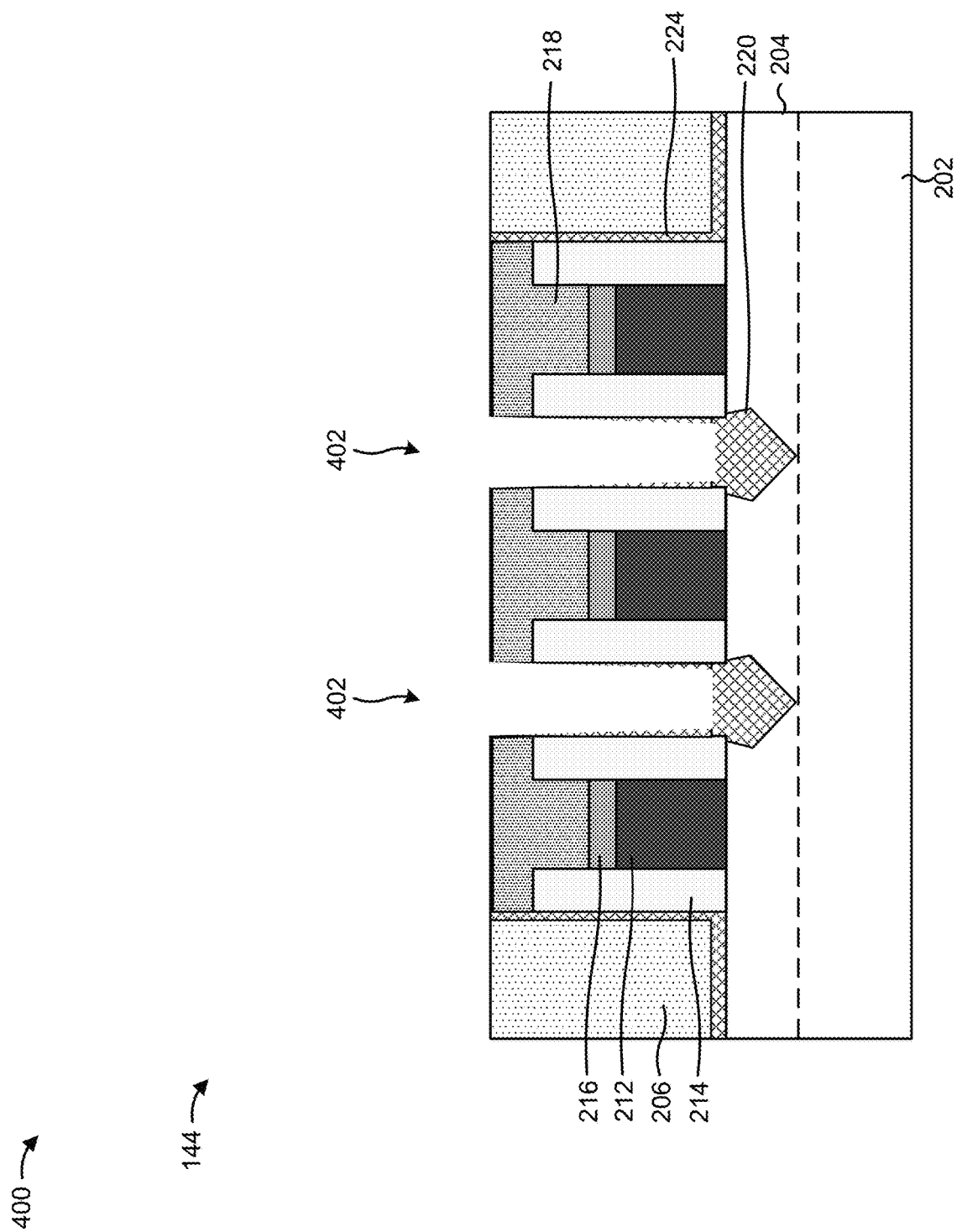

As shown in FIG. 4B, openings 402 are formed in the dielectric layer 206 between metal gate structures 212. In some implementations, a pattern in a photoresist layer is used to etch the dielectric layer 206 to form the openings 402. In these implementations, the deposition tool 102 forms the photoresist layer on the dielectric layer 206, on portions of the CESL 224, and on the dielectric capping layers 218. The exposure tool 104 exposes the photoresist layer to a radiation source to pattern the photoresist layer. The developer tool 106 develops and removes portions of the photoresist layer to expose the pattern. The etch tool 108 etches the dielectric layer 206 based on the pattern to form the openings 402 in the dielectric layer 206 to the source/drain regions 220. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for etching the dielectric layer 206 based on a pattern.

Figure 4C:
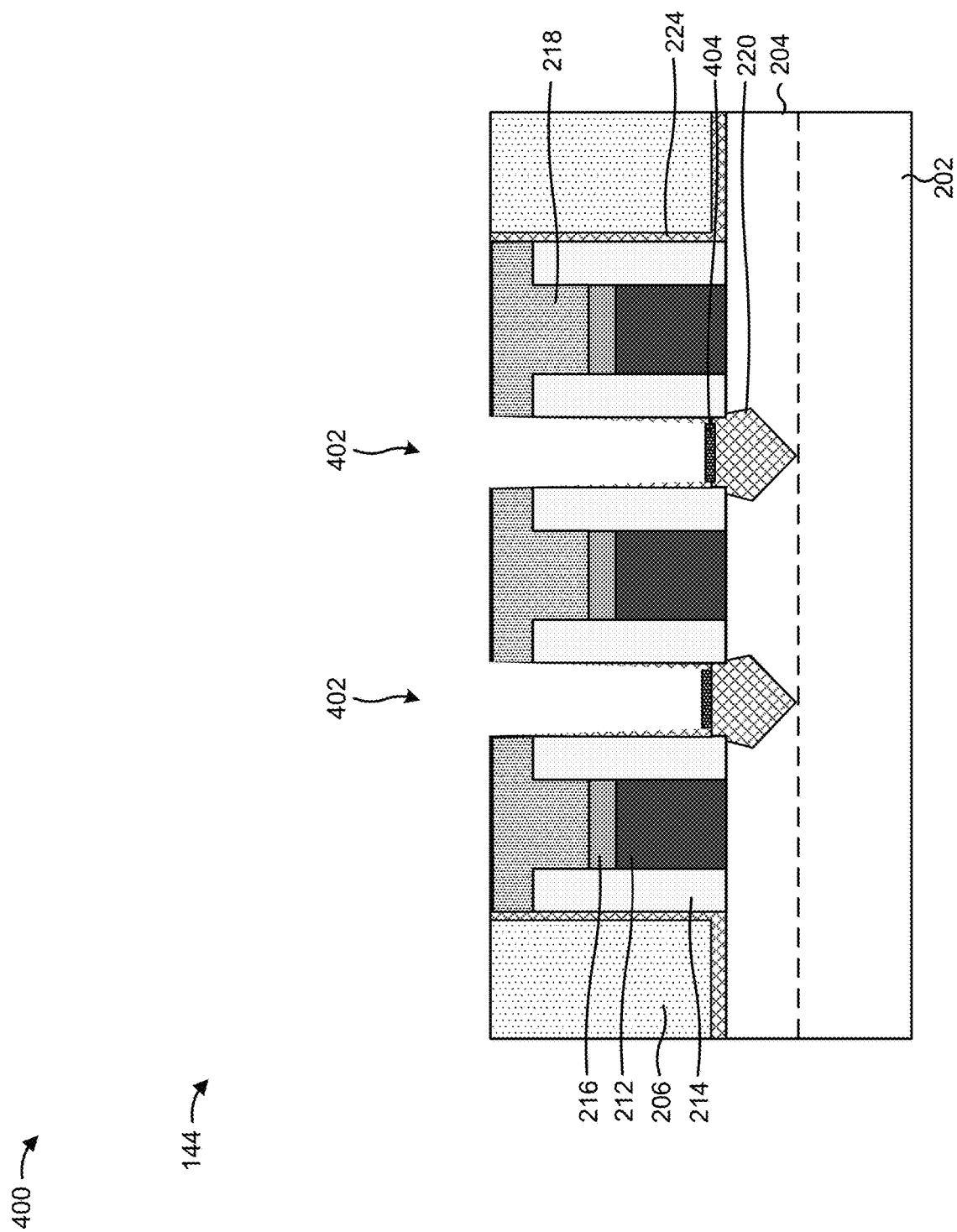

As shown in FIG. 4C, metal silicide layers 404 are formed over and/or on the source/drain regions 220 in the openings 402. The metal silicide layers 404 may be included to prevent oxide formation on the source/drain regions 220 and to reduce the contact resistance between the source/drain regions 220 and metal source/drain contacts that are to be formed over the source/drain regions 220. The metal silicide layers 404 may include a titanium silicide ($TiSi_x$), a ruthenium silicide ($RuSi_x$), and/or another metal silicide. In some implementations, the deposition tool 102 deposits a metal layer (e.g., a titanium (Ti) layer, a ruthenium (Ru) layer, or another metal layer) on the source/drain regions 220 (e.g., by an ALD operation, a CVD operation, a PVD operation, or another type of deposition operation). An anneal operation is performed on the semiconductor substrate 144. The anneal operation causes the metal layer to react with silicon in the source/drain regions 220, thereby forming the metal silicide layers 404.

Figure 4D:
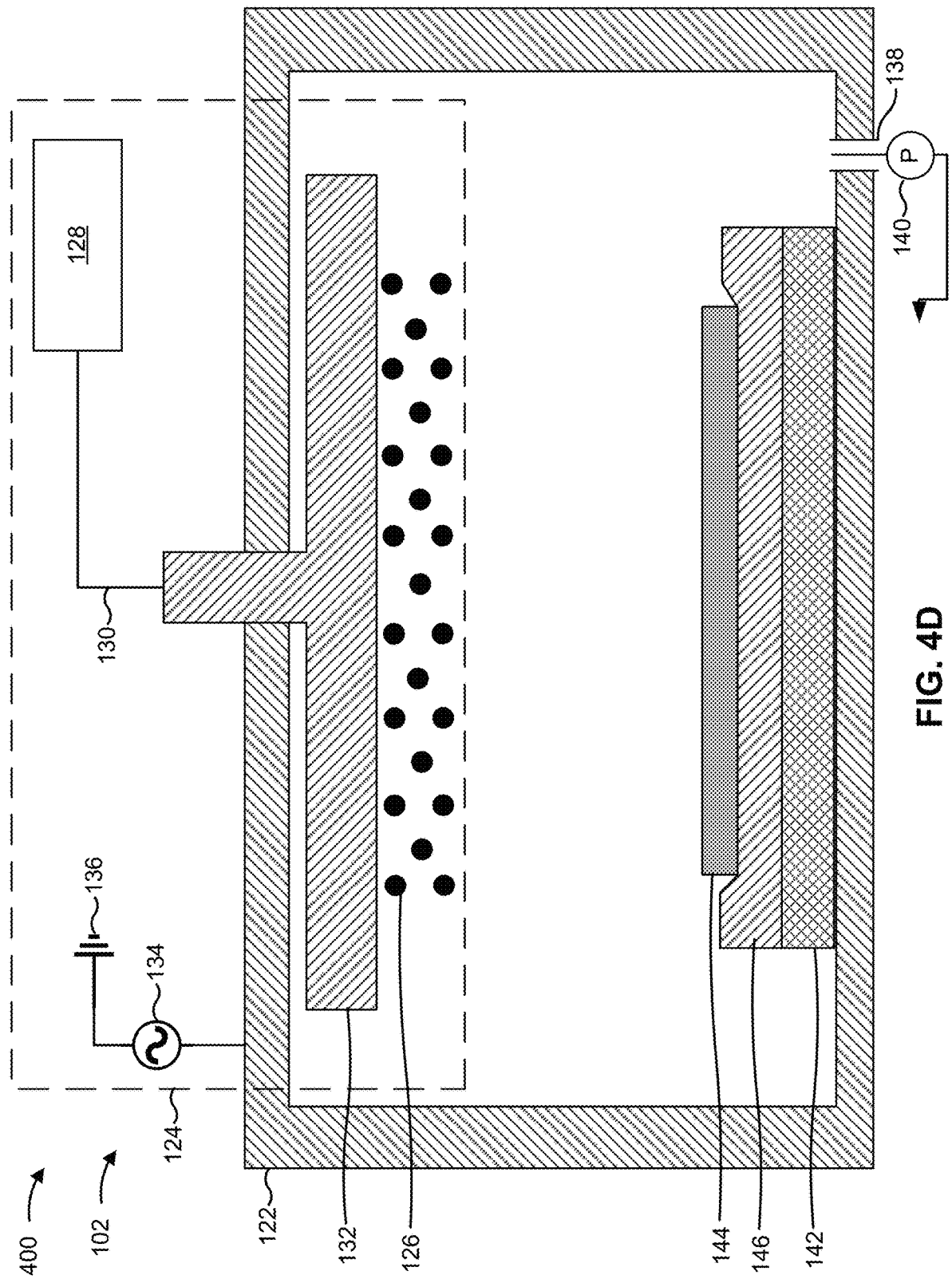

As shown in FIG. 4D, the semiconductor substrate 144 is positioned in the processing chamber 122 (e.g., the CVD processing chamber) of the CVD tool 120 such that a CVD operation may be performed to form the metal source/drain contacts 222 over and/or on the source/drain regions 220. The CVD operation includes providing a flow of the processing vapor 126 into the processing chamber 122 to form the metal source/drain contacts 222 on the semiconductor substrate 144. In some implementations, the metal source/drain contacts 222 are formed to a width that is in a range of approximately 20 nanometers to approximately 300 nanometers. In some implementations, the metal source/drain contacts 222 are formed to a width that is in a range of approximately 500 nanometers to approximately 1500 nanometers. In some implementations, the metal source/drain contacts 222 is formed to a width that is in a range of approximately 10 nanometers to approximately 40 nanometers. In some implementations, the metal source/drain contacts 222 are formed to another width. In some implementations, the metal source/drain contacts 222 are formed to a height or thickness that is in a range of approximately 30 nanometers to approximately 150 nanometers such that the top surfaces of the metal source/drain contacts 222 are approximately level with the top surfaces of the dielectric capping layers 218. In some implementations, the metal source/drain contacts 222 are formed to another height or thickness.

In some implementations, a ratio between a first width (e.g., an x-axis width) and a second width (e.g., a y-axis width) of the metal source/drain contacts 222 is in a range of approximately 1:30 to approximately 2:1. In some implementations, a ratio between a first width (e.g., an x-axis width) and a second width (e.g., a y-axis width) of the metal source/drain contacts 222 is in a range of approximately 1:150 to approximately 2:25. In some implementations, a ratio between a width (e.g., an x-axis width) and a height thickness (e.g., a z-axis dimension) of the metal source/drain contacts 222 is in a range of approximately 4:3 to approximately 1:15. In some implementations, a ratio between a width (e.g., a y-axis width) and a height thickness (e.g., a z-axis dimension) of the metal source/drain contacts 222 is in a range of approximately 10:1 to approximately 2:15. In some implementations, a ratio between a width (e.g., a y-axis width) and a height thickness (e.g., a z-axis dimension) of the metal source/drain contacts 222 is in a range of approximately 150:3 to approximately 50:15.

The CVD operation to deposit the metal source/drain contacts 222 includes performing a low-flow CVD operation to promote substantially uniform growth of the metal source/drain contacts 222 (the tungsten layers). The low-flow CVD operation may be performed using the concentration and/or flow rate of fluorine hexafluoride as described above for the low-flow CVD operation in FIG. 3D. Accordingly, the low-flow CVD operation may achieve similar properties and/or attributes for the metal source/drain contacts 222 as described above for the metal capping layer 216. Moreover, as a result of the lesser concentration of the tungsten hexafluoride in the flow of the processing vapor 126, the time duration for the low-flow CVD operation (e.g., to achieve the appropriate thickness for the metal source/drain contacts 222) is greater relative to the time duration for the high-flow CVD operation described above. As an example, the time duration for the low-flow CVD operation may be in a range of approximately 150 seconds to approximately 500 seconds to achieve the approximate thickness for the metal source/drain contacts 222, whereas the time duration for the high-flow CVD operation may be in a range of approximately 75 seconds to approximately 250 seconds to achieve a similar thickness.

Figure 4E:
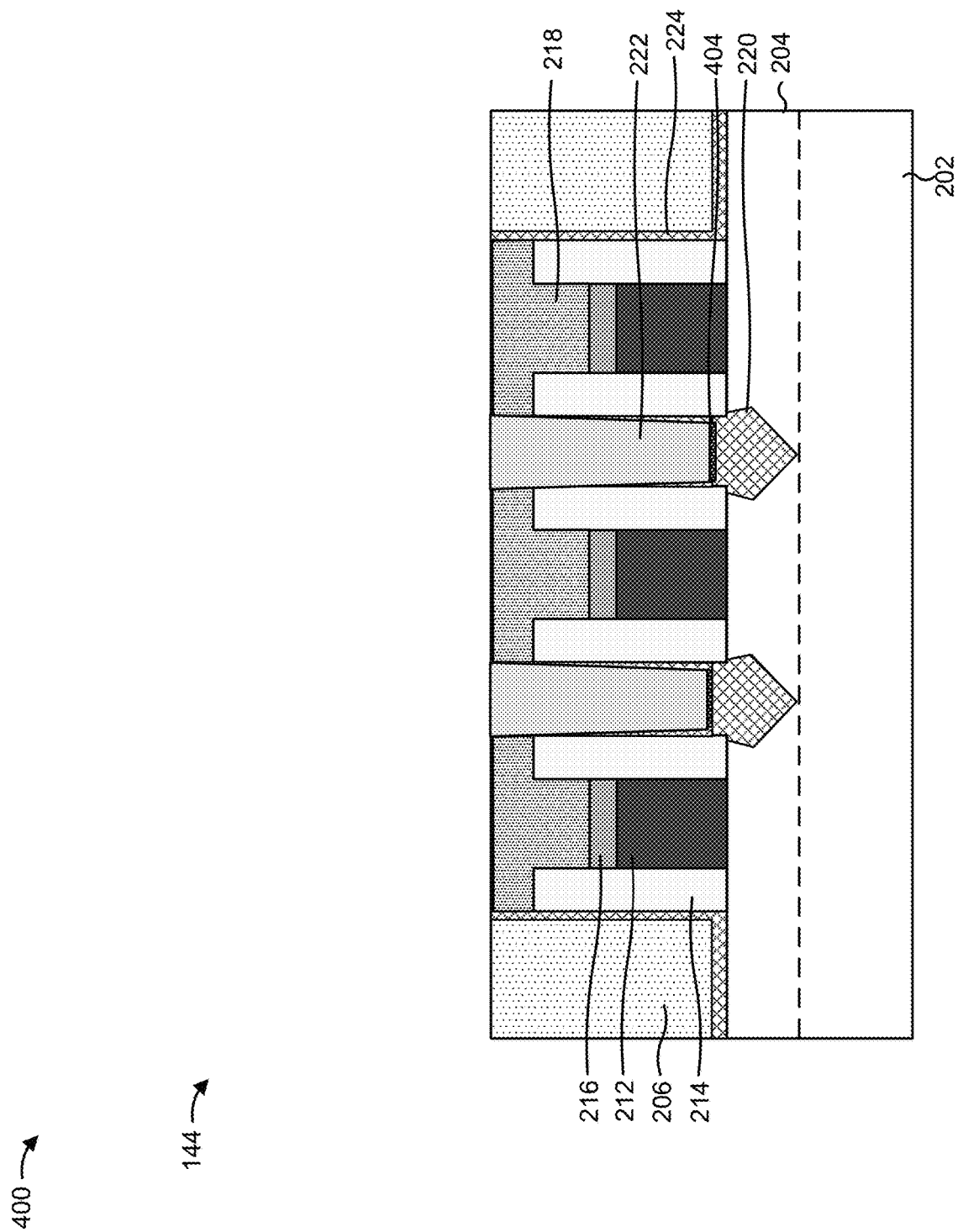

FIG. 4E illustrates the deposited metal source/drain contacts 222 on the source/drain regions 220, as formed by the low-flow CVD operation described above.

As indicated above, FIGS. 4A-4E are provided as an example. Other examples may differ from what is described with regard to FIGS. 4A-4E.

FIGS. 5A-5E are diagrams of examples implementation 500 described herein. The example implementation 500 includes an example of forming one or more layers and/or structures on the semiconductor substrate 144. In particular, the example implementation 500 includes a process in which a gate interconnect structure 226a is formed over a metal gate structure 212, and in which a source/drain interconnect structure 226b is formed over and/or on a metal source/drain contact 222. Turning FIG. 5A, one or more operations described in connection with FIGS. 3A-3F and/or FIGS. 4A-4E may be performed to form the metal gate structures 212, the metal capping layers 216, the dielectric capping layers 218, the dielectric layer 206, the CESL 224, and/or the metal source/drain contacts 222.

Figure 5A:
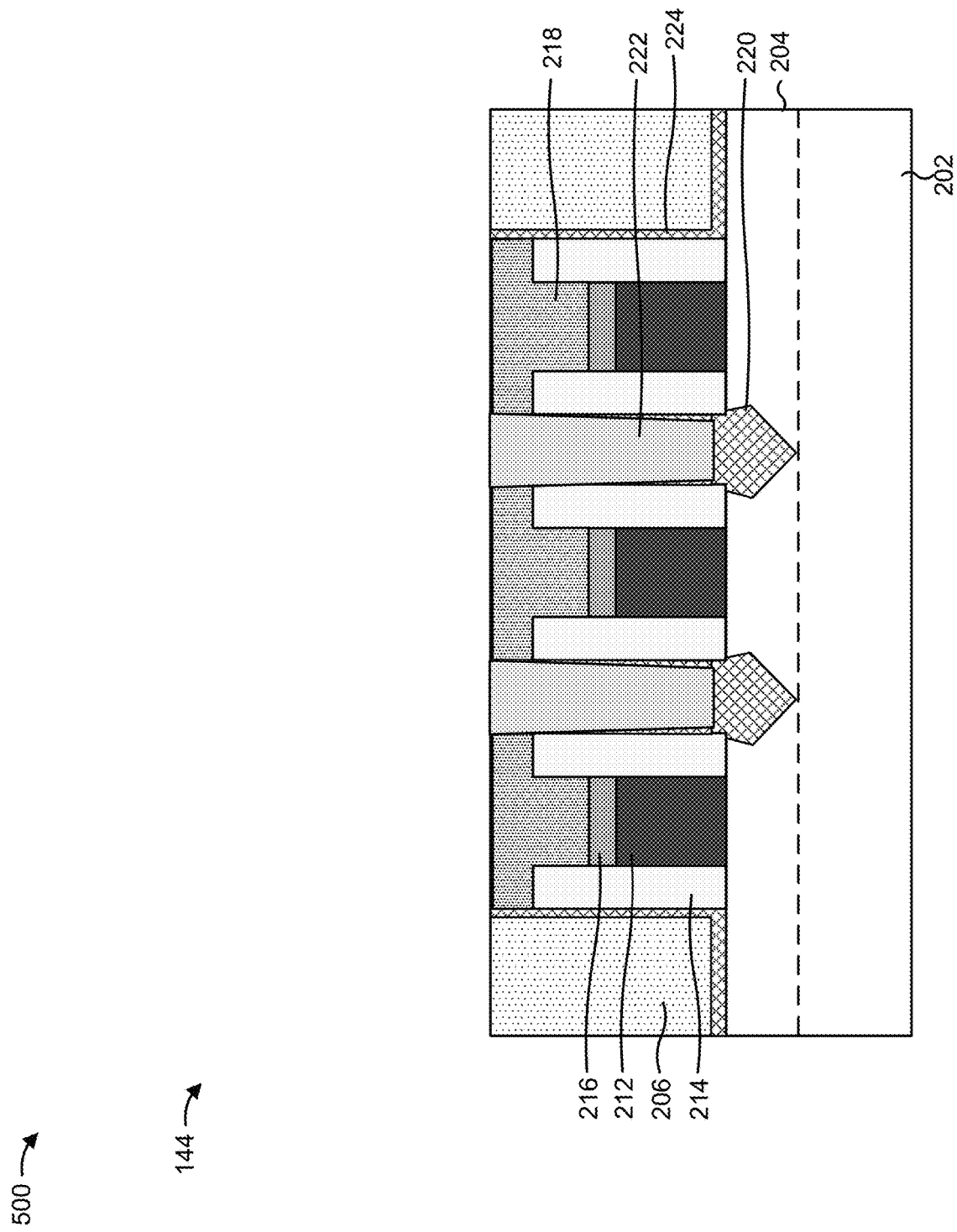
Figure 5B:
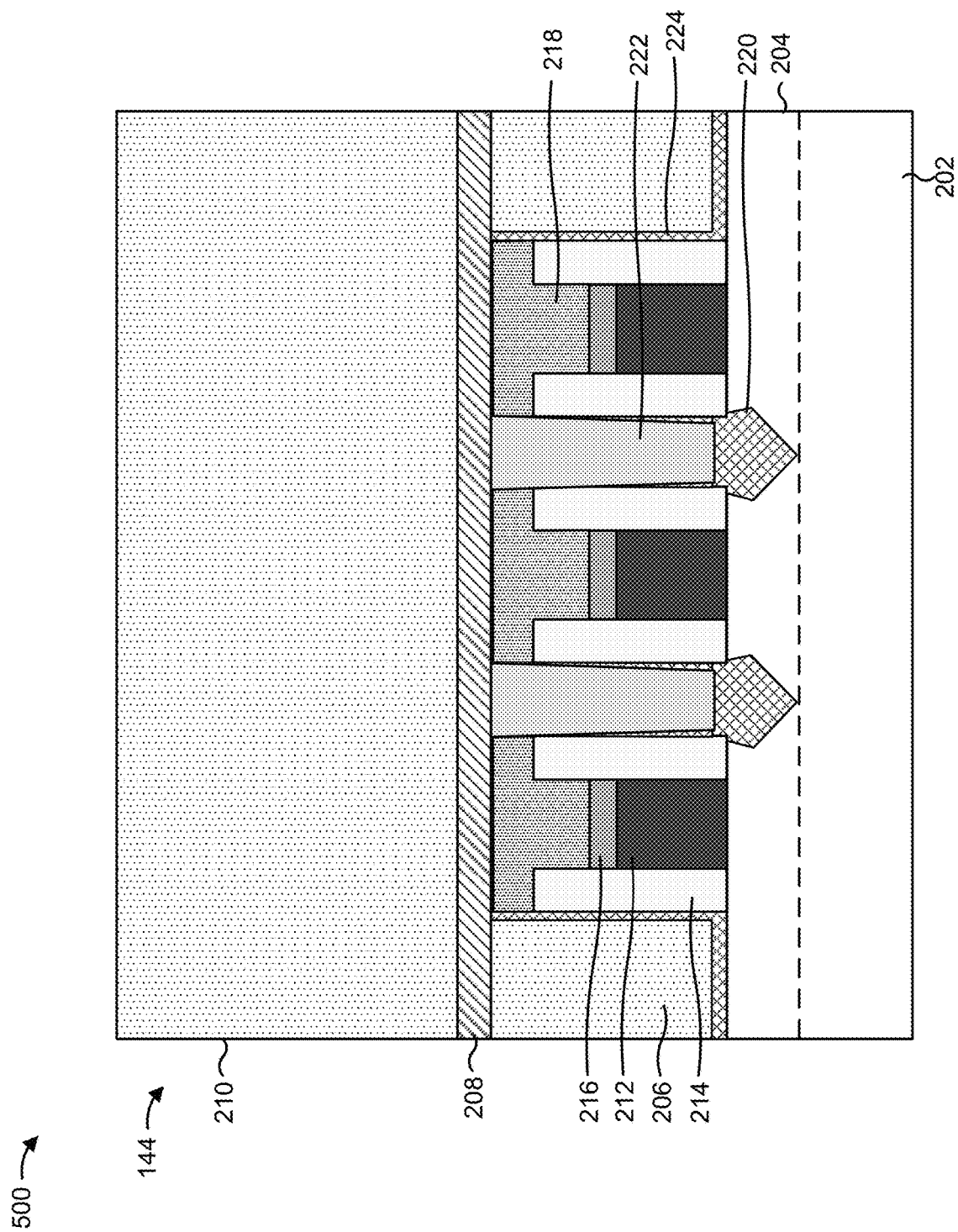

As shown in FIG. 5B, the ESL 208 is formed on the semiconductor substrate 144, and the dielectric layer 210 is formed over and/or on the ESL 208. In some implementations, a deposition tool 102 deposits the ESL 208 and the dielectric layer 210 by a CVD, ALD, PVD, and/or another deposition technique.

Figure 5C:
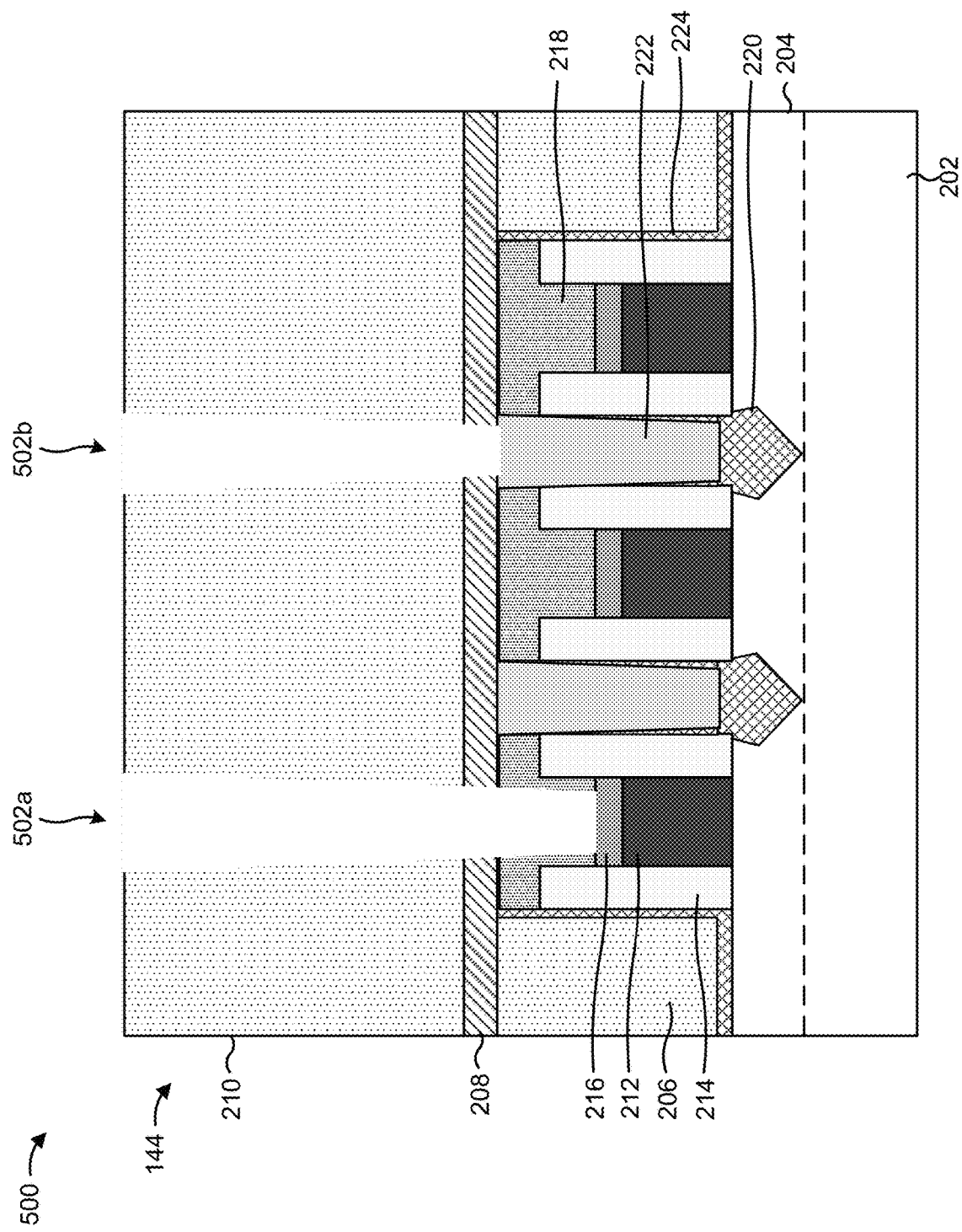

As shown in FIG. 5C, openings 502a and 502b are formed in the dielectric layer 210 and in the ESL 208. In particular, the opening 502a is formed in the dielectric layer 210, in the ESL 208, in a dielectric capping layer 218, and to a metal capping layer 216 over and/or on a metal gate structure 212. The opening 502b is formed in the dielectric layer 210 and in the ESL 208 to a metal source/drain contact 222. In some implementations, the opening 502a is formed directly to the metal gate structure 212.

In some implementations, a pattern in a photoresist layer is used to etch the dielectric layer 206 to form the openings 502a and 502b. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches the dielectric layer 210, the ESL 208, and/or the dielectric capping layer 218 based on the pattern to form the openings 502a and 502b. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for etching the openings 502a and 502b based on a pattern. In some implementations, the opening 502a and the opening 502b are formed by different patterning processes. For example, the opening 502a is formed before or after the opening 502b.

Figure 5D:
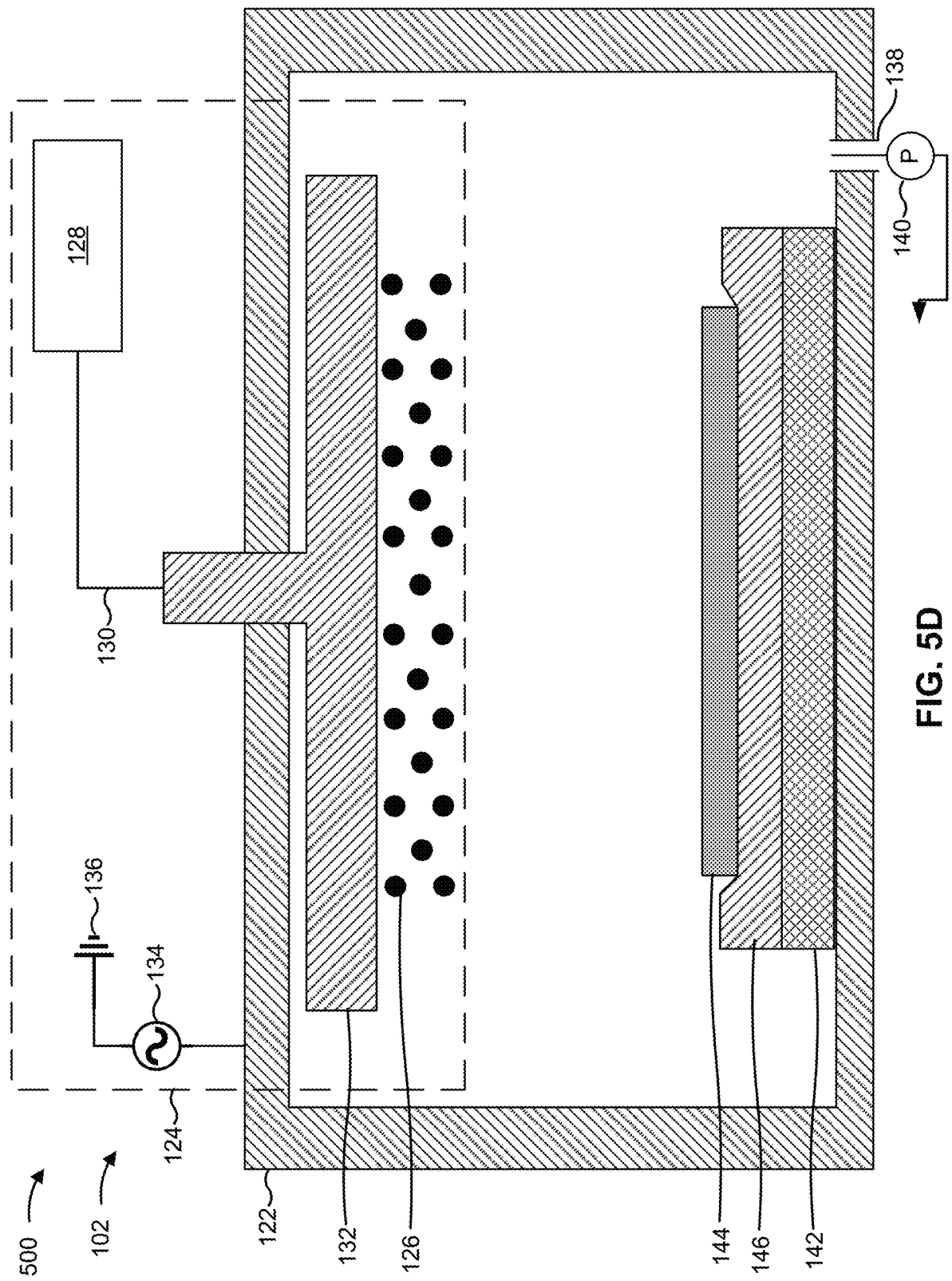

As shown in FIG. 5D, the semiconductor substrate 144 is positioned in the processing chamber 122 (e.g., the CVD processing chamber) of the CVD tool 120 such that a CVD operation may be performed to form the gate interconnect structure 226a in the opening 502a and over a metal gate structure 212. Moreover, the CVD operation may be performed to form the source/drain interconnect structure 226b in the opening 502b and over and/or on a metal source/drain contact 222. The CVD operation includes providing a flow of the processing vapor 126 into the processing chamber 122 to form the interconnect structures 226a and 226b. In some implementations, the interconnect structures 226a and 226b are each formed to a width that is in a range of approximately 10 nanometers to approximately 75 nanometers. In some implementations, the interconnect structures 226a and 226b are each formed to a width that is in a range of approximately 10 nanometers to approximately 20 nanometers. In some implementations, the interconnect structures 226a and 226b are formed to another width. In some implementations, the interconnect structure 226a is formed with a different width than the interconnect structure 226b. For example, the interconnect structure 226a may have a larger width than the interconnect structure 226b. In some implementations, the interconnect structures 226a and 226b are each formed to a height or thickness that is in a range of approximately 30 nanometers to approximately 150 nanometers. In some implementations, the interconnect structures 226a and 226b are formed to another height or thickness. In some implementations, the interconnect structure 226a is formed with a different height or thickness than the interconnect structure 226b. For example, the interconnect structure 226a may have a larger height or thickness than the interconnect structure 226b.

In some implementations, a ratio between a first width (e.g., an x-axis width) and a second width (e.g., a y-axis width) of one or more of the interconnect structures 226a and 226b is in a range of approximately 1:7.5 to approximately 2.5:1. In some implementations, a ratio between a width (e.g., an x-axis width) and a height thickness (e.g., a z-axis dimension) of one or more of the interconnect structures 226a and 226b is in a range of approximately 1:15 to approximately 5:6. In some implementations, a ratio between a width (e.g., a y-axis width) and a height thickness (e.g., a z-axis dimension) of one or more of the interconnect structures 226a and 226b is in a range of approximately 1:15 to approximately 15:6.

The CVD operation to deposit the interconnect structures 226a and 226b includes performing a low-flow CVD operation to promote substantially uniform growth of the metal source/drain contacts 222 (the tungsten layers). The low-flow CVD operation may be performed using the concentration and/or flow rate of fluorine hexafluoride as described above for the low-flow CVD operation in FIG. 3D. Accordingly, the low-flow CVD operation may achieve similar properties and/or attributes for the interconnect structures 226a and 226b as described above for the metal capping layer 216. Moreover, as a result of the lesser concentration of the tungsten hexafluoride in the flow of the processing vapor 126, the time duration for the low-flow CVD operation (e.g., to achieve the appropriate thickness for the interconnect structures 226a and 226b) is greater relative to the time duration for the high-flow CVD operation described above. As an example, the time duration for the low-flow CVD operation may be in a range of approximately 100 seconds to approximately 450 seconds to achieve the approximate thickness for the interconnect structures 226a and 226b, whereas the time duration for the high-flow CVD operation may be in a range of approximately 75 seconds to approximately 230 seconds to achieve a similar thickness.

Figure 5E:
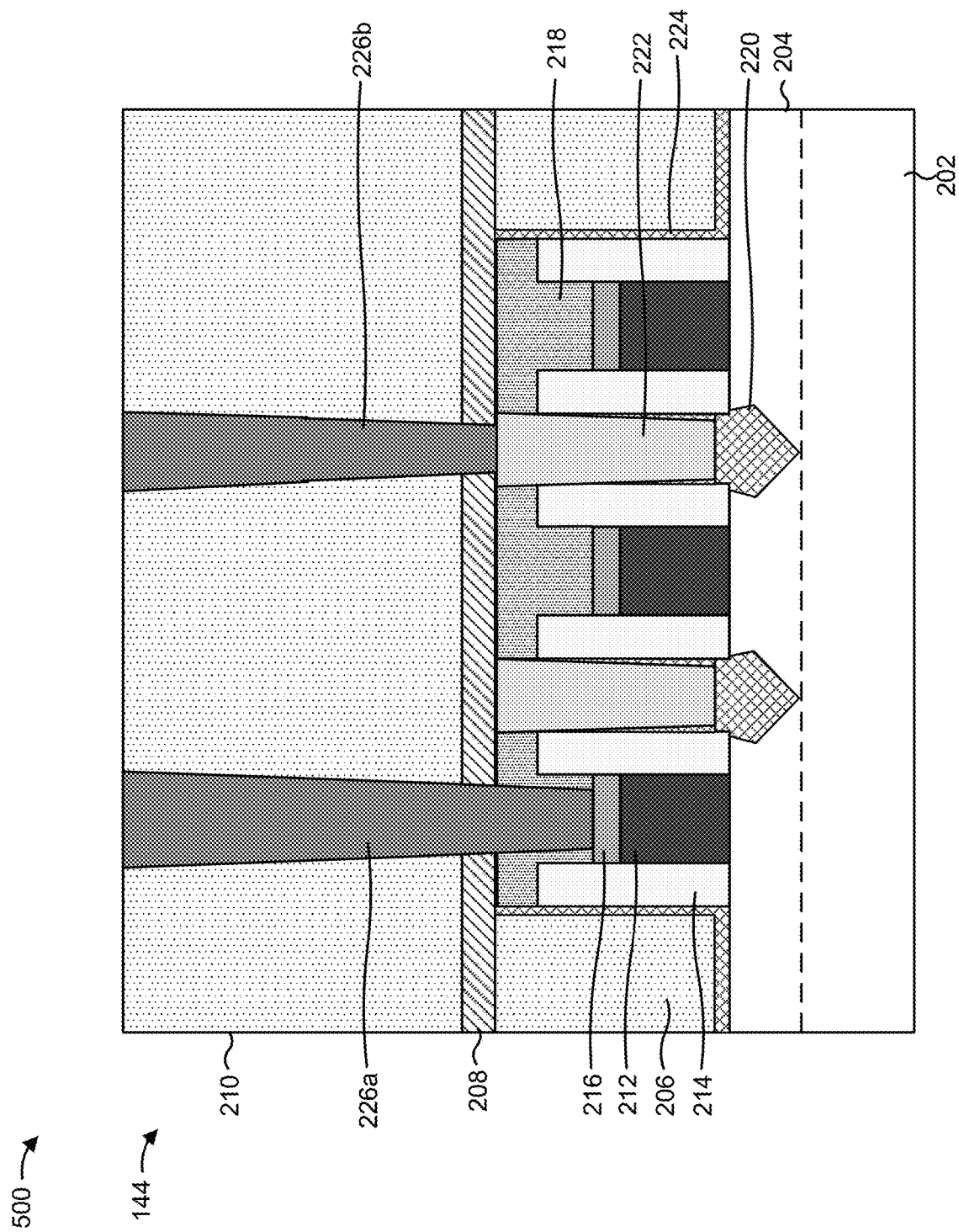

FIG. 5E illustrates the deposited gate interconnect structure 226a over the metal gate structure 212 and the source/drain interconnect structure 226b over and/or on the metal source/drain contact 222, as formed by the low-flow CVD operation described above. In some implementations, the deposited gate interconnect structure 226a and the source/drain interconnect structure 226b are formed by different patterning processes. For example, the deposited gate interconnect structure 226a is formed before or after the source/drain interconnect structure 226b.

As indicated above, FIGS. 5A-5E are provided as an example. Other examples may differ from what is described with regard to FIGS. 5A-5E.

FIGS. 6A and 6B are diagrams of example CVD deposition rates described herein. FIG. 6A illustrates an example sequence 610 of a high-flow CVD operation having a high deposition rate described herein. The high-flow CVD operation is performed to form a tungsten layer on a semiconductor substrate 612. As shown in FIG. 6A, tungsten precursors 614 are provided at a high concentration to achieve the high deposition rate of the high-flow CVD operation. The high deposition rate results in uneven (non-uniform) deposition of tungsten on the semiconductor substrate 612, which may result in the formation of tungsten islands, discontinuities, voids, and/or poor surface uniformity of the tungsten layer on the semiconductor substrate 612.

FIG. 6B illustrates an example sequence 620 of a low-flow CVD operation, described herein, having a lower deposition rate to the high-flow CVD operation. The low-flow CVD operation is performed to form a tungsten layer on a semiconductor substrate 622, which may correspond to the semiconductor substrate 144. As shown in FIG. 6B, tungsten precursors 624 are provided at a lower concentration relative to the concentration of tungsten precursors 614 in the high-flow CVD operation. This results in the lower deposition rate and, as a result, a slower tungsten layer formation on the semiconductor substrate 622 relative to the tungsten layer formation on the semiconductor substrate 612. As further shown in FIG. 6B, the lower deposition rate results in a more uniform deposition of tungsten on the semiconductor substrate 622 relative to the deposition of tungsten on the semiconductor substrate 612. Moreover, the lower deposition rate may reduce the incubation time for the tungsten layer on the semiconductor substrate 622 relative to the higher deposition rate used to form the tungsten layer on the semiconductor substrate 612.

As indicated above, FIGS. 6A and 6B are provided as examples. Other examples may differ from what is described with regard to FIGS. 6A and 6B.

Figure 7A:
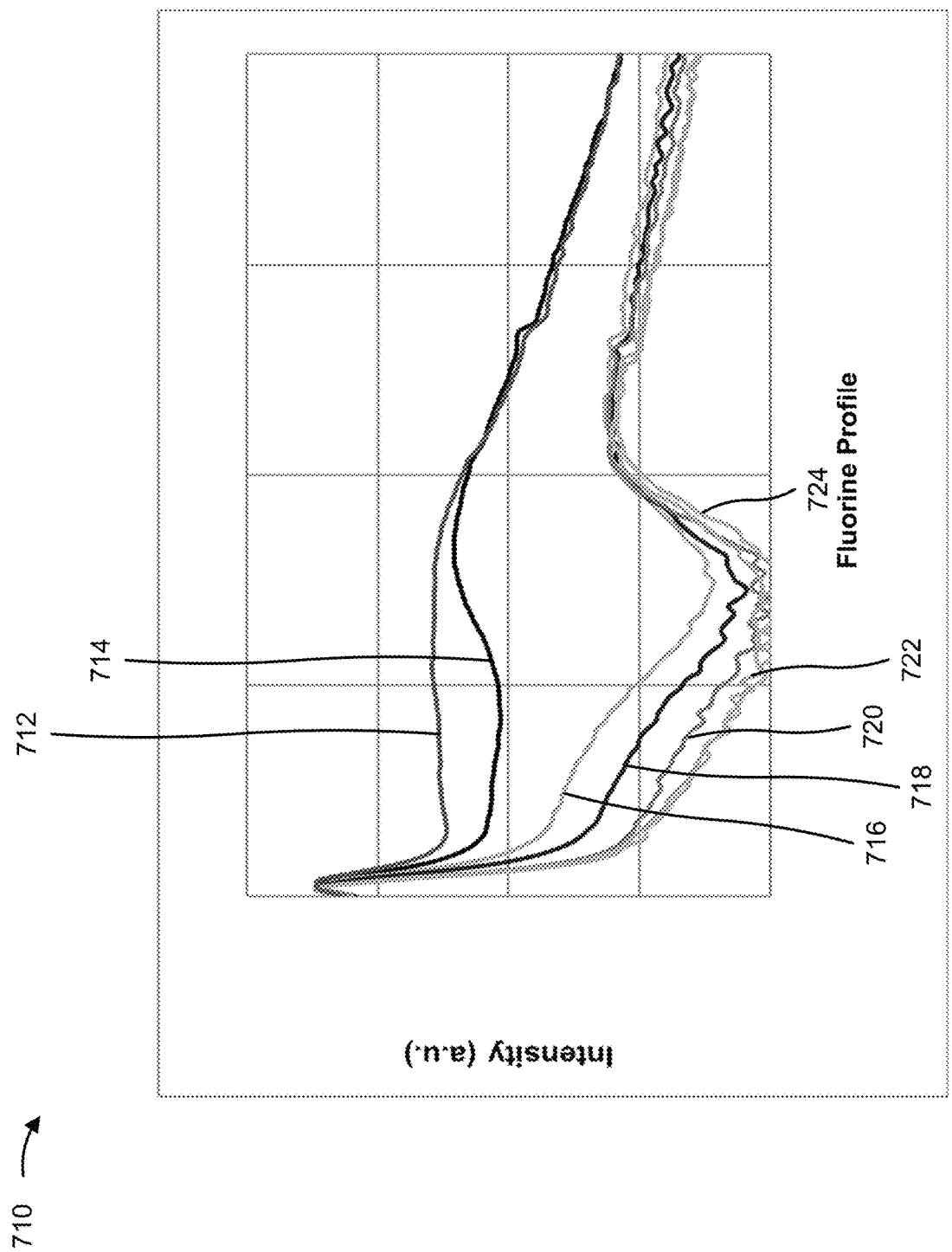
FIGS. 7A and 7B are diagrams of example fluorine intensities in semiconductor devices described herein.
Figure 7B:
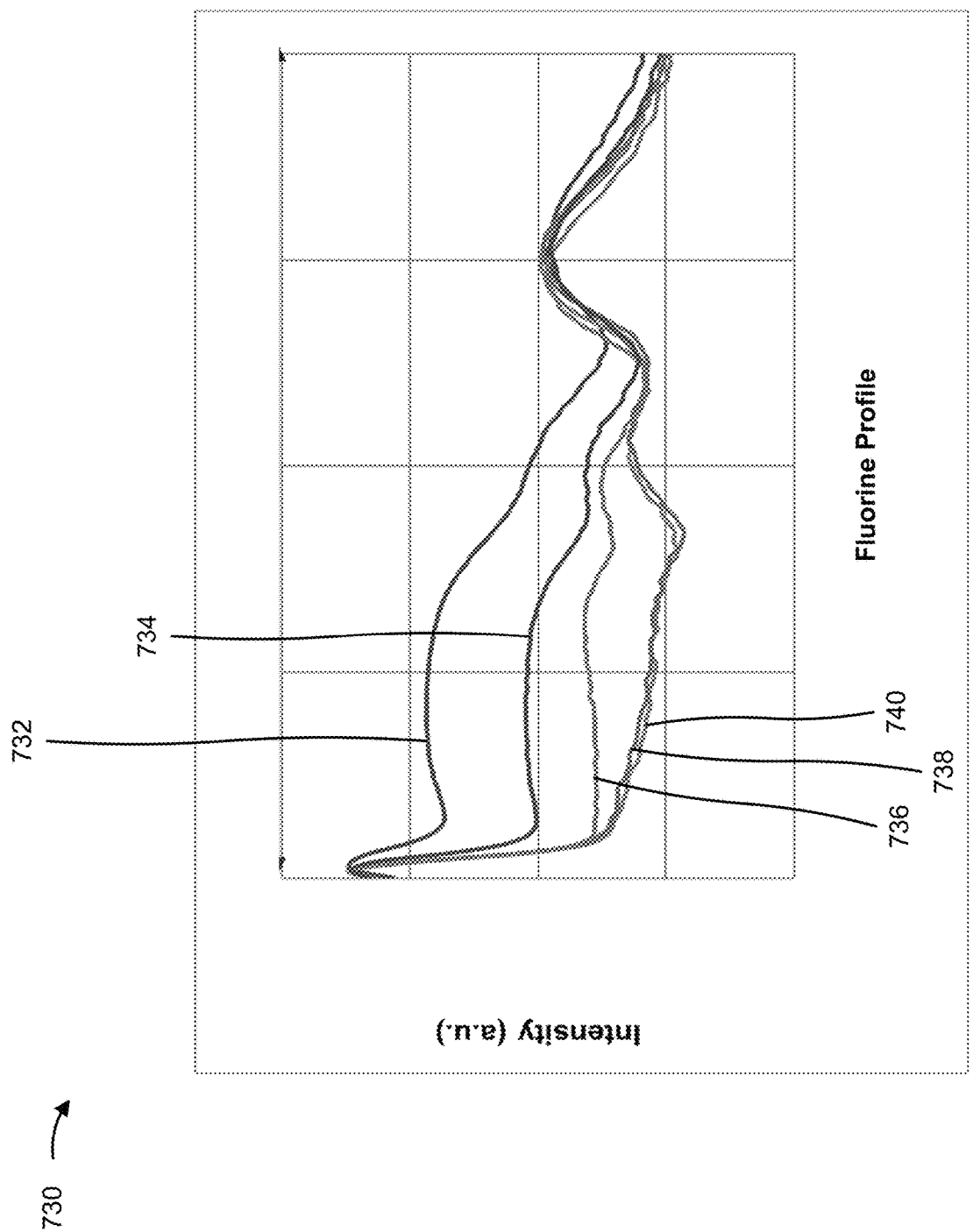

FIGS. 7A and 7B are diagrams of example fluorine intensities in semiconductor devices described herein. FIG. 7A illustrates an example 710 of fluorine intensities in semiconductor devices on which tungsten layers are formed. The semiconductor devices include a tungsten layer (e.g., of approximately 100 angstrom thickness or another thickness) on a cobalt layer (e.g., of approximately 40 angstrom thickness or another thickness). The example 710 illustrates the fluorine intensities in tungsten layer and in the cobalt layer (from left to right in the data plot).

The lines in the data plot in the example 710 represent fluorine intensities for different tungsten hexafluoride concentrations that might be used in CVD operations to form the tungsten layers of the semiconductor devices. The line 712 represents the fluorine intensity in a tungsten layer on a cobalt layer of a semiconductor device for which a high tungsten hexafluoride concentration was used. The line 714 represents the fluorine intensity in a tungsten layer on a cobalt layer of a semiconductor device for which a tungsten hexafluoride concentration that is lower than the tungsten hexafluoride concentration associated with line 712 was used. The line 716 represents the fluorine intensity in a tungsten layer on a cobalt layer of a semiconductor device for which a tungsten hexafluoride concentration that is lower than the tungsten hexafluoride concentration associated with line 714 was used. The line 718 represents the fluorine intensity in a tungsten layer on a cobalt layer of a semiconductor device for which a tungsten hexafluoride concentration that is lower than the tungsten hexafluoride concentration associated with line 716 was used. The line 720 represents the fluorine intensity in a tungsten layer on a cobalt layer of a semiconductor device for which a tungsten hexafluoride concentration that is lower than the tungsten hexafluoride concentration associated with line 718 was used. The line 722 represents the fluorine intensity in a tungsten layer on a cobalt layer of a semiconductor device for which a tungsten hexafluoride concentration that is lower than the tungsten hexafluoride concentration associated with line 720 was used. The line 724 represents the fluorine intensity in a tungsten layer on a cobalt layer of a semiconductor device for which a tungsten hexafluoride concentration that is lower than the tungsten hexafluoride concentration associated with line 722 was used.

As shown in FIG. 7A, the intensity (and thus, the concentration) of fluorine in the tungsten layers and the cobalt layers of the semiconductor devices generally decreases correspondingly with the decrease in hexafluoride concentration from line 712 to line 724. Thus, the low-flow CVD operations described herein may achieve a lesser fluorine concentration, which reduces the damage (and/or the likelihood of damage) to the cobalt layers caused by the fluorine in the tungsten hexafluoride and/or reduces the impact of the fluorine in the tungsten hexafluoride on the resistivity between the tungsten layers and the cobalt layers of the semiconductor devices.

FIG. 7B illustrates an example 730 of fluorine intensities in semiconductor devices on which tungsten layers are formed. The semiconductor devices include an upper tungsten layer (e.g., of approximately 100 angstrom thickness or another thickness) on a lower tungsten layer (e.g., of approximately 30 angstrom thickness). The example 730 illustrates the fluorine intensities in upper tungsten layer and in the lower tungsten layer (from left to right in the data plot).

The lines in the data plot in the example 730 represent fluorine intensities for different tungsten hexafluoride concentrations that might be used in CVD operations to form the upper tungsten layers of the semiconductor devices. The line 732 represents the fluorine intensity in an upper tungsten layer on a lower tungsten layer of a semiconductor device for which a high tungsten hexafluoride concentration was used. The line 734 represents the fluorine intensity in an upper tungsten layer on a lower tungsten layer of a semiconductor device for which a tungsten hexafluoride concentration that is lower than the tungsten hexafluoride concentration associated with line 732 was used. The line 736 represents the fluorine intensity in an upper tungsten layer on a lower tungsten layer of a semiconductor device for which a tungsten hexafluoride concentration that is lower than the tungsten hexafluoride concentration associated with line 734 was used. The line 738 represents the fluorine intensity in an upper tungsten layer on a lower tungsten layer of a semiconductor device for which a tungsten hexafluoride concentration that is lower than the tungsten hexafluoride concentration associated with line 736 was used. The line 740 represents the fluorine intensity in an upper tungsten layer on a lower tungsten layer of a semiconductor device for which a tungsten hexafluoride concentration that is lower than the tungsten hexafluoride concentration associated with line 738 was used.

As shown in FIG. 7B, the intensity (and thus, the concentration) of fluorine in the upper tungsten layers and in a lower tungsten layers of the semiconductor devices generally decreases correspondingly with the decrease in hexafluoride concentration from line 732 to line 740. Thus, the low-flow CVD operations described herein may achieve a lesser fluorine concentration, which reduces the damage (and/or the likelihood of damage) to the lower tungsten layers caused by the fluorine in the tungsten hexafluoride and/or reduces the impact of the fluorine in the tungsten hexafluoride on the resistivity between the upper tungsten layers and the lower tungsten layers of the semiconductor devices.

As indicated above, FIGS. 7A and 7B are provided as examples. Other examples may differ from what is described with regard to FIGS. 7A and 7B.

Figure 8:
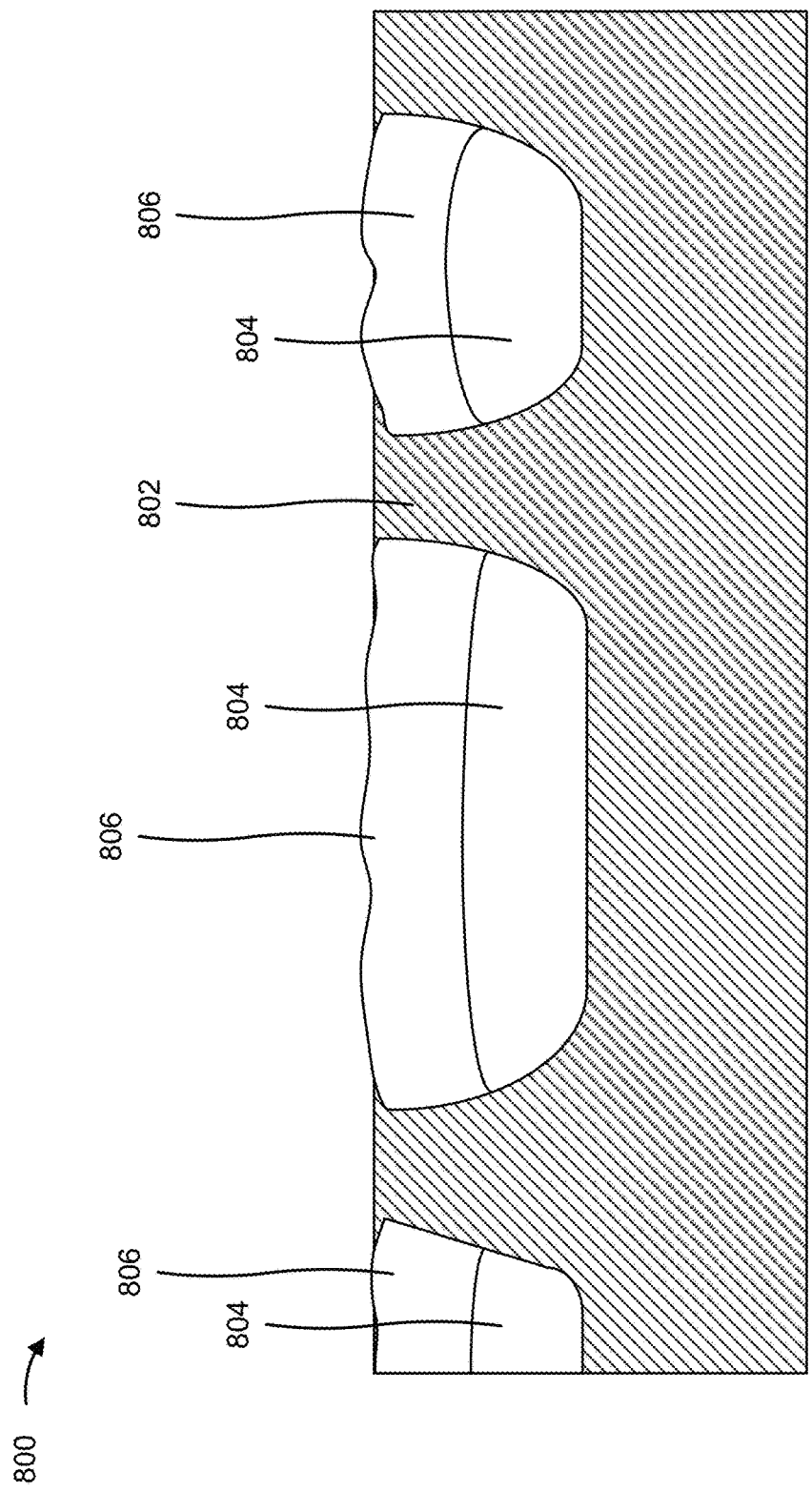
FIG. 8 is a diagram of an example semiconductor device described herein.

FIG. 8 is a diagram of an example semiconductor device 800 described herein. The semiconductor device 800 includes an example of a semiconductor device that may be formed on the semiconductor substrate 144. As shown in FIG. 8, the semiconductor device 800 includes a substrate 802, which may correspond to the semiconductor substrate 144 and/or the device substrate 202. The semiconductor device 800 further includes a lower layer 804 included in the substrate 802 and an upper layer 806 on the lower layer 804. The lower layer 804 includes metal layer (e.g., a cobalt layer, a tungsten layer), a metal silicide layer, or another type of layer. In some implementations, the lower layer 804 corresponds to a metal gate structure 212, a metal source/drain contact 222, a metal capping layer 216, a metal silicide layer 404, and/or a metal gate contact, among other examples. The lower layer 804 may include curved sides and an approximately flat bottom surface. The top surface of the lower layer 804 may be approximately curved.

The upper layer 806 includes a tungsten layer such as a metal source/drain contact 222, a metal capping layer 216, a metal gate contact, a gate interconnect structure 226a, and/or a source/drain interconnect structure 226b, among other examples. The bottom surface of the upper layer 806 may conform to the approximately curved top surface of the lower layer 804. Moreover, the upper layer 806 may include approximately curved sides.

The upper layer 806 is formed by one or more of the low-flow CVD operations described herein. Accordingly, the top surface of the upper layer 806 is substantially uniform and free of voids, islands, and/or other types of discontinuities. Moreover, the top surface of the upper layer 806 may have relatively low surface roughness and grain size (e.g., relative to another tungsten layer formed by a high-flow CVD operation).

As indicated above, FIG. 8 is provided as an example. Other examples may differ from what is described with regard to FIG. 8.

Figure 9:
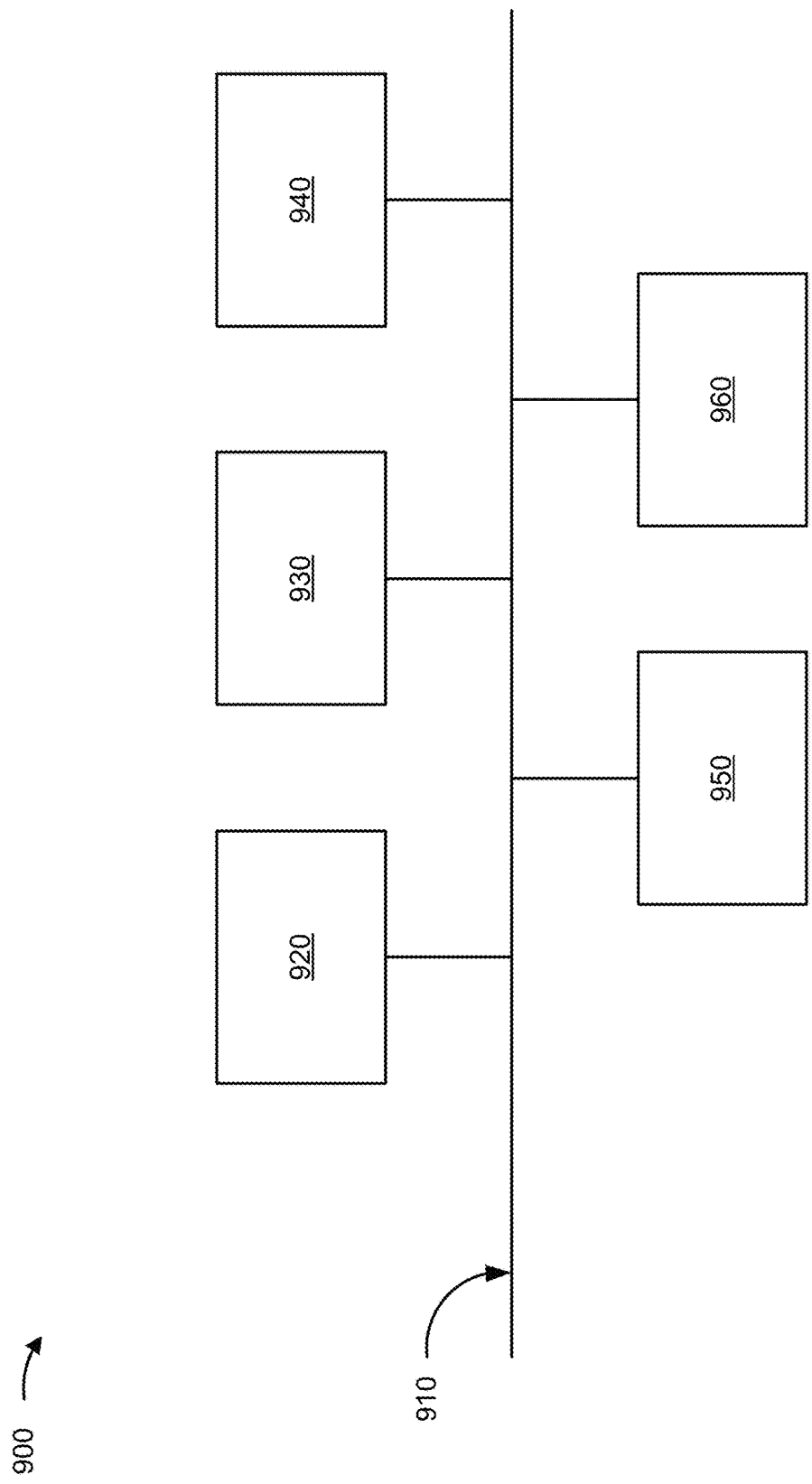
FIG. 9 is a diagram of example components of one or more devices of FIGS. 1A and 1B described herein.

FIG. 9 is a diagram of example components of a device 900. In some implementations, the deposition tool 102 (e.g., the CVD tool 120 or one or more components included in the CVD tool 120 described herein), the exposure tool 104, the developer tool 106, the etch tool 108, the planarization tool 110, and/or the wafer/die transport tool 112 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry may be used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
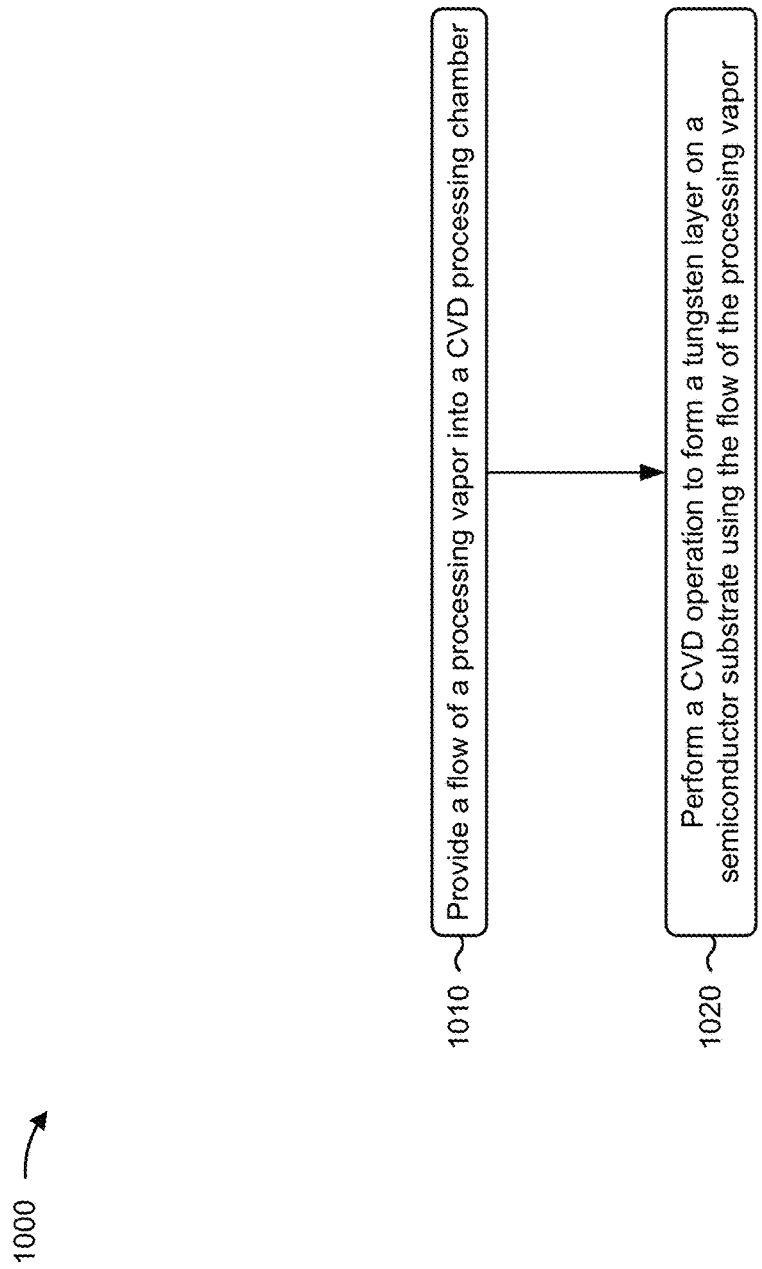
FIGS. 10 and 11 are flowcharts of example processes relating to chemical vapor deposition for uniform tungsten growth described herein.

FIG. 10 is a flowchart of an example process 1000 relating to low flow chemical vapor deposition for uniform tungsten growth described herein. In some implementations, one or more process blocks of FIG. 10 may be performed by a CVD tool (e.g., the CVD tool 120, a deposition tool 102). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include providing a flow of a processing vapor into a CVD processing chamber (block 1010). For example, the CVD tool 120 (e.g., using the vapor supply system 124) may provide a flow of a processing vapor 126 into a CVD processing chamber (e.g., the processing chamber 122 of the deposition tool 102), as described herein. In some implementations, the flow of the processing vapor 126 includes a combination of tungsten hexafluoride ($WF_6$) and a carrier gas.

As further shown in FIG. 10, process 1000 may include performing a CVD operation to form a tungsten layer on a semiconductor substrate using the flow of the processing vapor (block 1020). For example, the CVD tool 120 (e.g., using the processing chamber 122) may perform a CVD operation to form a tungsten layer (e.g., the metal capping layer 216, the metal source/drain contact 222, the gate interconnect structure 226a, and/or the source/drain interconnect structure 226) on the semiconductor substrate 144 using the flow of the processing vapor 126, as described herein. In some implementations, the flow of the processing vapor 126 is provided such that a flow rate of the tungsten hexafluoride in the flow of the processing vapor 126 results in the tungsten layer being grown at a slower rate than a higher flow rate of the tungsten hexafluoride to promote substantially uniform growth of the tungsten layer.

Process 1000 may include additional implementations, such as any single implementation or any combination of implementations described below and/or in connection with one or more other processes described elsewhere herein.

In a first implementation, the flow rate of the tungsten hexafluoride in the flow of the processing vapor 126 is in a range of approximately 1 SCCM to approximately 10 SCCM. In a second implementation, alone or in combination with the first implementation, the flow rate of the tungsten hexafluoride in the flow of the processing vapor 126 is configured to achieve a surface roughness for the tungsten layer that is in a range of approximately 0.9 RMS roughness to approximately 1.2 RMS roughness. In a third implementation, alone or in combination with one or more of the first and second implementations, the flow rate of the tungsten hexafluoride in the flow of the processing vapor 126 is configured to achieve a fluorine concentration in the tungsten layer that is in a range of approximately 100 arbitrary units to approximately 10000 arbitrary units.

In a fourth implementation, alone or in combination with one or more of the first through third implementations, the tungsten layer includes a metal source/drain contact 222 that is formed over a source/drain region 220 on the semiconductor substrate 144, and a time duration of the CVD operation, resulting from the flow rate of the tungsten hexafluoride, is in a range of approximately 150 seconds to approximately 500 seconds. In a fifth implementation, alone or in combination with one or more of the first through fourth implementations, the tungsten layer includes a metal capping layer 216 that is formed over a metal gate structure 212 on the semiconductor substrate 144, and a time duration of the CVD operation, resulting from the flow rate of the tungsten hexafluoride, is in a range of approximately 40 seconds to approximately 100 seconds. In a sixth implementation, alone or in combination with one or more of the first through fifth implementations, the tungsten layer includes an interconnect structure (e.g., the gate interconnect structure 226a, the source/drain interconnect structure 226b) that is formed over a metal gate structure 212 or over a metal source/drain contact 222 that is formed over a source/drain region 220 on the semiconductor substrate, and a time duration of the CVD operation, resulting from the flow rate of the tungsten hexafluoride, is in a range of approximately 100 seconds to approximately 450 seconds.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
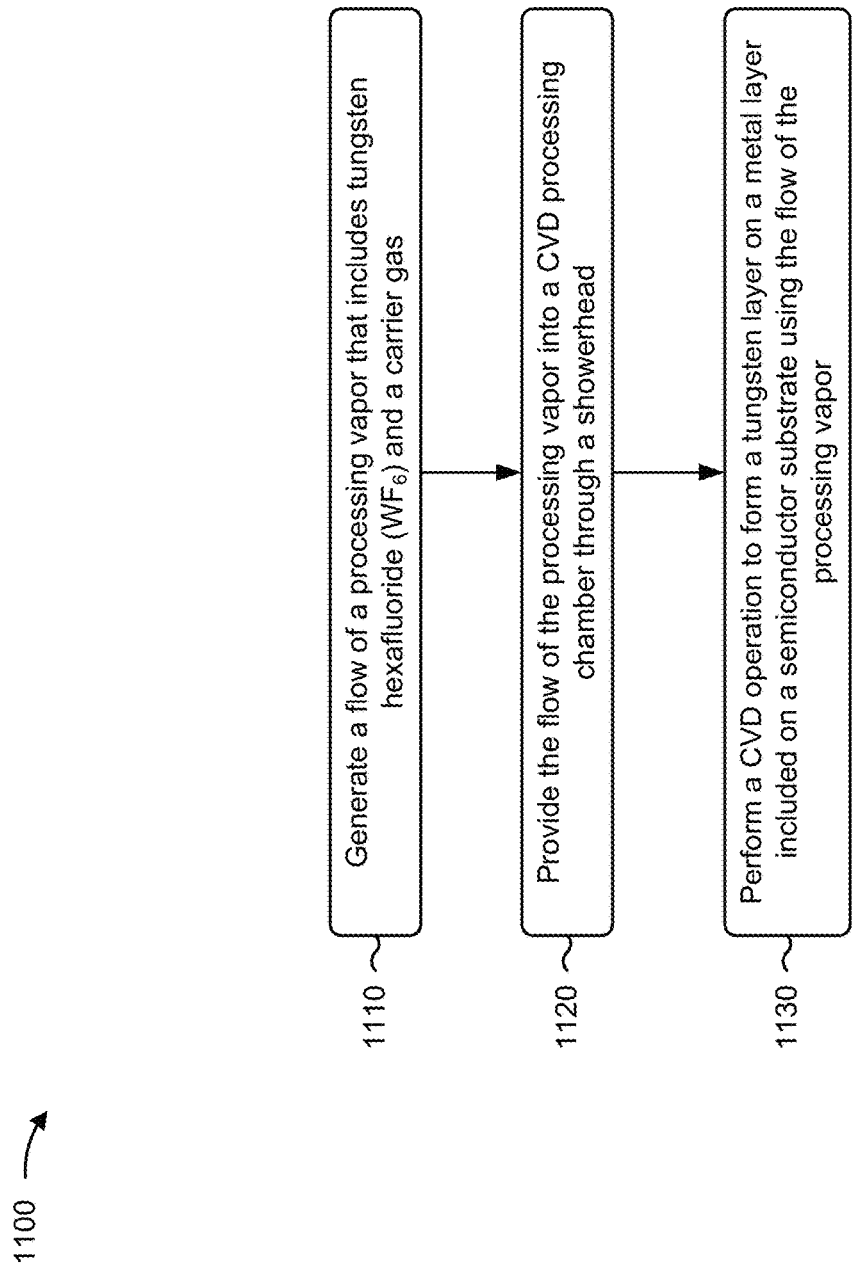

FIG. 11 is a flowchart of an example process 1100 relating to low flow chemical vapor deposition for uniform tungsten growth described herein. In some implementations, one or more process blocks of FIG. 11 may be performed by a CVD tool (e.g., the CVD tool 120, a deposition tool 102). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include generating a flow of a processing vapor (126) that includes tungsten hexafluoride ($WF_6$) and a carrier gas (block 1110). For example, the CVD tool 120 (e.g., using the vapor supply system 124) may generate a flow of a processing vapor 126 that includes tungsten hexafluoride ($WF_6$) and a carrier gas, as described herein.

As further shown in FIG. 11, process 1100 may include providing the flow of the processing vapor into a CVD processing chamber through a showerhead (block 1120). For example, the CVD tool 120 (e.g., using the vapor supply system 124) may provide the flow of the processing vapor into a CVD processing chamber (e.g., the processing chamber 122) through the showerhead 132, as described herein.

As further shown in FIG. 11, process 1100 may include performing a CVD operation to form a tungsten layer on a metal layer included on a semiconductor substrate using the flow of the processing vapor (block 1130). For example, the CVD tool 120 (e.g., using the processing chamber 122) may perform a CVD operation to form a tungsten layer (e.g., a metal capping layer 216, a metal source/drain contact 222, a gate interconnect structure 226a, and/or a source/drain interconnect structure 226) on a metal layer (e.g., a metal gate structure 212, a metal capping layer 216, a metal source/drain contact 222, and/or a metal silicide layer 404) included on the semiconductor substrate 144 using the flow of the processing vapor 126, as described herein. In some implementations, a ratio between the tungsten hexafluoride and the carrier gas in the flow of the processing vapor 126 results in a deposition rate for the CVD operation that is greater than a deposition rate for an ALD operation. In some implementations, the ratio between the tungsten hexafluoride and the carrier gas in the flow of the processing vapor 126 results in surface uniformity performance for the CVD operation that is approximately equal to a surface uniformity performance for the ALD operation. In some implementations, the tungsten layer is formed as a result of a reaction during the CVD operation that results in tungsten of the tungsten hexafluoride being deposited onto the metal layer, and results in formation of a hydrofluoric acid as a by-product. In some implementations, a concentration of the tungsten hexafluoride in the flow of the processing vapor 126 is configured to reduce fluorine concentration in the tungsten layer.

Process 1100 may include additional implementations, such as any single implementation or any combination of implementations described below and/or in connection with one or more other processes described elsewhere herein.

In a first implementation, the ratio of the tungsten hexafluoride to the carrier gas in the flow of the processing vapor 126 is in a range of approximately 1:7200 to approximately 10:5400. In a second implementation, alone or in combination with the first implementation, performing the CVD operation to form the tungsten layer includes performing the CVD operation to form the tungsten layer as part of a dummy gate replacement process (e.g., the process illustrated and described in connection with FIGS. 3A-3F). In a third implementation, alone or in combination with one or more of the first and second implementations, the ratio between the tungsten hexafluoride and the carrier gas in the flow of the processing vapor 126 promotes uniform growth of the tungsten layer.

In a fourth implementation, alone or in combination with one or more of the first through third implementations, the ratio between the tungsten hexafluoride and the carrier gas in the flow of the processing vapor 126 is configured to reduce a grain size of the tungsten layer. In a fifth implementation, alone or in combination with one or more of the first through fourth implementations, performing the CVD operation to form the tungsten layer includes performing the CVD operation to selectively deposit the tungsten layer on the metal layer between dielectric sidewalls (e.g., the ESL 208, the dielectric layer 210, a plurality of sidewall spacers 214, a dielectric capping layer 218, and/or the CESL 224) of an opening (e.g., an opening 312, an opening 402a, an opening 402b, an opening 502a, and/or an opening 502b)

over the metal layer. In a sixth implementation, alone or in combination with one or more of the first through fifth implementations, the metal layer includes at least one of a metal gate structure 212, a metal capping layer 216, a metal gate contact, or a metal source/drain contact 222.

In a seventh implementation, alone or in combination with one or more of the first through sixth implementations, the concentration of the tungsten hexafluoride in the flow of the processing vapor 126 is configured to reduce island formation in the tungsten layer. In an eighth implementation, alone or in combination with one or more the first through seventh implementations, the concentration of the tungsten hexafluoride in the flow of the processing vapor 126 is configured to reduce pattern loading for the tungsten layer. In a ninth implementation, alone or in combination with one or more of the first through eighth implementations, the concentration of the tungsten hexafluoride in the flow of the processing vapor 126 is in a range of approximately 1 SCCM to approximately 10 SCCM.

In a tenth implementation, alone or in combination with one or more of the first through ninth implementations, performing the CVD operation to form the tungsten layer includes performing the CVD operation to deposit the tungsten layer on the metal layer between dielectric sidewalls of an opening over the metal layer (e.g., the ESL 208, the dielectric layer 210, a plurality of sidewall spacers 214, a dielectric capping layer 218, and/or the CESL 224) of an opening (e.g., an opening 312, an opening 402a, an opening 402b, an opening 502a, and/or an opening 502b), where the tungsten hexafluoride resists deposition onto the dielectric sidewalls. In an eleventh implementation, alone or in combination with one or more of the first through tenth implementations, the fluorine concentration in the tungsten layer is in a range of approximately 100 arbitrary units to approximately 10000 arbitrary units.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

In this way, the low-flow tungsten CVD techniques described herein provide uniform deposition of tungsten on a semiconductor substrate. In some implementations described herein, a flow of a processing vapor is provided to a CVD processing chamber such that a flow rate of tungsten hexafluoride in the processing vapor results in the tungsten layer being grown at a slower rate than a higher flow rate of the tungsten hexafluoride to promote substantially uniform growth of the tungsten layer. In this way, the low-flow tungsten CVD techniques described herein may be used to achieve similar surface uniformity performance to an atomic layer deposition (ALD) while being a faster deposition process relative to ALD (e.g., due to the lower deposition rate and large quantity of alternating processing cycles of ALD). This reduces the likelihood of defect formation in the tungsten layer while increasing the throughput of semiconductor device processing for the semiconductor substrate (and other semiconductor substrates).

As described in greater detail above, some implementations described herein provide a method. The method includes providing a flow of a processing vapor into a CVD processing chamber, where the flow of the processing vapor includes a combination of tungsten hexafluoride ($WF_6$) and a carrier gas. The method includes performing a CVD operation to form a tungsten layer on a semiconductor substrate using the flow of the processing vapor, where the flow of the processing vapor is provided such that a flow rate of the tungsten hexafluoride in the flow of the processing vapor results in the tungsten layer being grown at a slower rate than a higher flow rate of the tungsten hexafluoride to promote substantially uniform growth of the tungsten layer.

As described in greater detail above, some implementations described herein provide a method. The method includes generating, by a vapor supply system, a flow of a processing vapor that includes tungsten hexafluoride ($WF_6$) and a carrier gas. The method includes providing, by the vapor supply system, the flow of the processing vapor into a CVD processing chamber through a showerhead. The method includes performing a CVD operation to form a tungsten layer on a metal layer included on a semiconductor substrate using the flow of the processing vapor, where a ratio between the tungsten hexafluoride and the carrier gas in the flow of the processing vapor results in a deposition rate for the CVD operation that is greater than a deposition rate for an ALD operation, and where the ratio between the tungsten hexafluoride and the carrier gas in the flow of the processing vapor results in surface uniformity performance for the CVD operation that is approximately equal to a surface uniformity performance for the ALD operation.

As described in greater detail above, some implementations described herein provide a method. The method includes generating, by a vapor supply system, a flow of a processing vapor that includes tungsten hexafluoride ($WF_6$) and a carrier gas. The method includes providing, by the vapor supply system, the flow of the processing vapor into a CVD processing chamber through a showerhead. The method includes performing a CVD operation to form a tungsten layer on a metal layer included on a semiconductor substrate using the flow of the processing vapor, where the tungsten layer is formed as a result of a reaction during the CVD operation that results in tungsten of the tungsten hexafluoride being deposited onto the metal layer, and results in formation of a hydrofluoric acid as a by-product, and where a concentration of the tungsten hexafluoride in the flow of the processing vapor is configured to reduce fluorine concentration in the tungsten layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a flow of a processing vapor into a chemical vapor deposition (CVD) processing chamber,
      wherein the flow of the processing vapor includes a combination of tungsten hexafluoride and a carrier gas; and
   performing a CVD operation to form a tungsten layer on a semiconductor substrate using the flow of the processing vapor,
      wherein the flow of the processing vapor is provided in a single deposition cycle such that a flow rate of the tungsten hexafluoride in the flow of the processing vapor is in a range of approximately 1 standard cubic centimeter per minute (SCCM) to about 10 SCCM to promote substantially uniform growth of the tungsten layer to achieve a deposition rate of approximately 3 angstroms per second and to achieve a surface roughness of the tungsten layer that is in a range of approximately 0.9 root mean squared (RMS) roughness to approximately 1.2 RMS roughness.

2. The method of claim 1, wherein the flow rate of the tungsten hexafluoride in the flow of the processing vapor is configured to achieve a fluorine concentration in the tungsten layer that is in a range of approximately 100 arbitrary units to approximately 10000 arbitrary units.

3. The method of claim 1, wherein the tungsten layer comprises a metal source/drain contact that is formed over a source/drain region on the semiconductor substrate; and
wherein a time duration of the CVD operation, resulting from the flow rate of the tungsten hexafluoride, is in a range of approximately 150 seconds to approximately 500 seconds.

4. The method of claim 1, wherein the tungsten layer comprises a metal capping layer that is formed over a metal gate structure on the semiconductor substrate; and
wherein a time duration of the CVD operation, resulting from the flow rate of the tungsten hexafluoride, is in a range of approximately 40 seconds to approximately 100 seconds.

5. The method of claim 1, wherein the tungsten layer comprises an interconnect structure that is formed over a metal gate structure or over a metal source/drain contact that is formed over a source/drain region on the semiconductor substrate; and
wherein a time duration of the CVD operation, resulting from the flow rate of the tungsten hexafluoride, is in a range of approximately 100 seconds to approximately 450 seconds.

6. The method of claim 1, further comprising:
generating, via a vapor supply system, a vapor from a source material; and
mixing, via the vapor supply system, the vapor with a carrier gas to generate the processing vapor,
wherein the processing vapor is provided by the vapor supply system into the processing chamber.

7. The method of claim 6, further comprising:
purging, via a pump, at least one of oxygen or the processing vapor from the CVD processing chamber.

8. The method of claim 1, wherein the flow of the processing vapor is provided via a shower head.

9. A method, comprising:
generating, by a vapor supply system, a flow of a processing vapor that includes tungsten hexafluoride and a carrier gas;
providing, by the vapor supply system, the flow of the processing vapor into a chemical vapor deposition (CVD) processing chamber through a showerhead; and
performing a CVD operation to form a tungsten layer on a metal layer included on a semiconductor substrate using the flow of the processing vapor,
wherein the flow of the processing vapor is provided in a single deposition such that a flow rate of the tungsten hexafluoride in the flow of the processing vapor is in a range of approximately 1 standard cubic centimeter per minute (SCCM) to about 10 SCCM to promote substantially uniform growth of the tungsten layer to achieve a deposition rate of approximately 3 angstroms per second and to achieve a surface roughness of the tungsten layer that is in a range of approximately 0.9 root mean squared (RMS) roughness to approximately 1.2 RMS roughness,
wherein a ratio between the tungsten hexafluoride and the carrier gas in the flow of the processing vapor is in a range of approximately 1:7200 to approximately 10:5400, and
wherein the ratio between the tungsten hexafluoride and the carrier gas in the flow of the processing vapor results in surface uniformity performance for the CVD operation.

10. The method of claim 9, wherein performing the CVD operation to form the tungsten layer comprises:
performing the CVD operation to form the tungsten layer as part of a dummy gate replacement process.

11. The method of claim 9, wherein the ratio between the tungsten hexafluoride and the carrier gas in the flow of the processing vapor promotes substantially uniform growth of the tungsten layer.

12. The method of claim 9, wherein the ratio between the tungsten hexafluoride and the carrier gas in the flow of the processing vapor is configured to reduce a grain size of the tungsten layer.

13. The method of claim 9, wherein performing the CVD operation to form the tungsten layer comprises:
performing the CVD operation to selectively deposit the tungsten layer on the metal layer between dielectric sidewalls of an opening over the metal layer.

14. The method of claim 9, wherein the metal layer comprises at least one of:
a metal gate structure,
a metal capping layer,
a metal gate contact, or
a metal source/drain contact.

15. The method of claim 9, wherein the flow rate of the tungsten hexafluoride in the flow of the processing vapor is configured to achieve a fluorine concentration in the tungsten layer that is in a range of approximately 100 arbitrary units to approximately 10000 arbitrary units.

16. A method, comprising:
generating, by a vapor supply system, a flow of a processing vapor that includes tungsten hexafluoride and a carrier gas;
providing, by the vapor supply system, the flow of the processing vapor into a chemical vapor deposition (CVD) processing chamber through a showerhead; and
performing a CVD operation to form a tungsten layer on a metal layer included on a semiconductor substrate using the flow of the processing vapor,
wherein the flow of the processing vapor is provided in a single deposition such that a flow rate of the tungsten hexafluoride in the flow of the processing vapor is in a range of approximately 1 standard cubic centimeter per minute (SCCM) to about 10 SCCM to promote substantially uniform growth of the tungsten layer to achieve a deposition rate of approximately 3 angstroms per second and to achieve a surface roughness of the tungsten layer that is in a range of approximately 0.9 root mean squared (RMS) roughness to approximately 1.2 RMS roughness,
wherein a ratio between the tungsten hexafluoride and the carrier gas in the flow of the processing vapor is in a range of approximately 1:7200 to approximately 10:5400,
wherein the tungsten layer is formed as a result of a reaction during the CVD operation that results in tungsten of the tungsten hexafluoride being deposited onto the metal layer, and results in formation of a hydrofluoric acid as a by-product, and wherein a concentration of the tungsten hexafluoride in the flow of the processing vapor is configured to reduce a fluorine concentration in the tungsten layer.

17. The method of claim 16, wherein the concentration of the tungsten hexafluoride in the flow of the processing vapor is configured to reduce island formation in the tungsten layer.

18. The method of claim 16, wherein the concentration of the tungsten hexafluoride in the flow of the processing vapor is configured to reduce pattern loading for the tungsten layer.

19. The method of claim 16, wherein performing the CVD operation to form the tungsten layer comprises:

performing the CVD operation to deposit the tungsten layer on the metal layer between dielectric sidewalls of an opening over the metal layer, wherein the tungsten hexafluoride resists deposition onto the dielectric sidewalls.

20. The method of claim 16, wherein the fluorine concentration in the tungsten layer is in a range of approximately 100 arbitrary units to approximately 10000 arbitrary units.

* * * * *